United States Patent [19]
Otsuka et al.

[11] Patent Number: 5,568,501
[45] Date of Patent: Oct. 22, 1996

[54] SEMICONDUCTOR LASER AND METHOD FOR PRODUCING THE SAME

[75] Inventors: Nobuyuki Otsuka, Kawanishi; Masahiro Kitoh, Toyonaka; Masato Ishino, Shijyonawate; Yasushi Matsui, Neyagawa, all of Japan

[73] Assignee: Matsushita Electric Industrial Co., Ltd., Osaka, Japan

[21] Appl. No.: 331,939

[22] Filed: Oct. 31, 1994

[30] Foreign Application Priority Data

Nov. 1, 1993 [JP] Japan ................................ 5-273441
May 30, 1994 [JP] Japan ................................ 6-116616

[51] Int. Cl.⁶ ................................................ H01S 3/19
[52] U.S. Cl. ................................................ 372/46; 372/45
[58] Field of Search ................................ 372/46, 45

[56] References Cited

U.S. PATENT DOCUMENTS

| | | | |
|---|---|---|---|
| 5,214,662 | 5/1993 | Irikawa et al. | 372/46 |
| 5,390,205 | 2/1995 | Mori et al. | 372/46 |

FOREIGN PATENT DOCUMENTS

| | | |
|---|---|---|
| 61-164287 | 7/1986 | Japan . |
| 3-161988 | 7/1991 | Japan . |

OTHER PUBLICATIONS

A. W. Nelson et al., "The Role of MOVPE in The Manufacture of High Performance InP Based Optoelectronic Devices", *Journal of Crystal Growth 93*, pp. 792–802 (1988). (No month).

K. Uomi et al., "Modulation–Doped Multi–Quantum Well (MD–MQW) Lasers", *Japanese Journal of Applied Physics*, vol. 29, No. 1, pp. 88–94 (Jan. 1990).

*Primary Examiner*—James W. Davie
*Attorney, Agent, or Firm*—Ratner & Prestia

[57] ABSTRACT

The semiconductor laser of the invention includes: a semiconductor substrate of a first conductivity type; a stripe-shaped multilayer structure, formed on the semiconductor substrate, the stripe-shaped multilayer structure including an active layer; and a current blocking portion formed on the semiconductor substrate on both sides of the stripe-shaped multilayer structure, wherein the current blocking portion has a first current blocking layer of a second conductivity type, and a second current blocking layer of the first conductivity type formed on the first current blocking layer, the first current blocking layer includes a low-concentration region having a relatively low concentration of an impurity of the second conductivity type, and a high-concentration region having an impurity concentration which is higher than that of the low-concentration region, and the low-concentration region is provided at a position closer to the stripe-shaped multilayer structure than the high-concentration region.

19 Claims, 19 Drawing Sheets

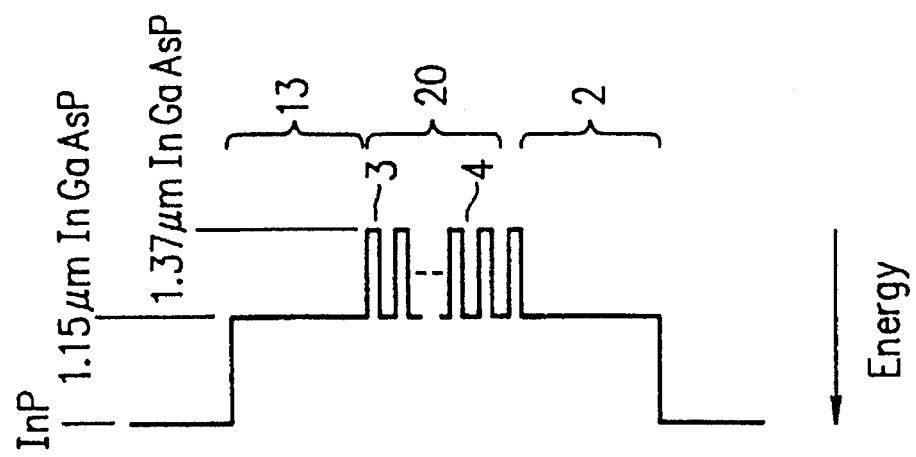
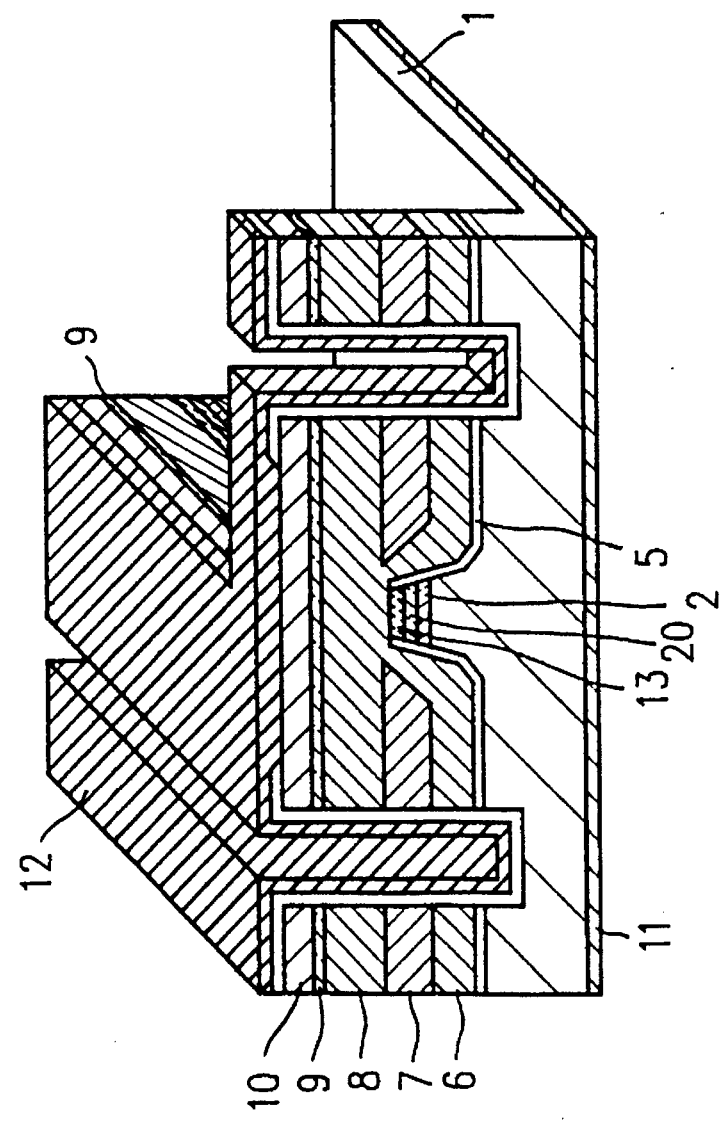
FIG. 1B
FIG. 1A

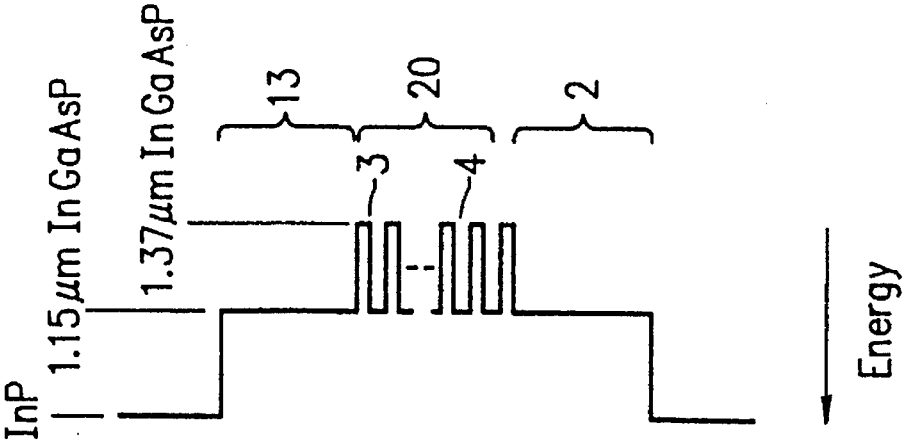
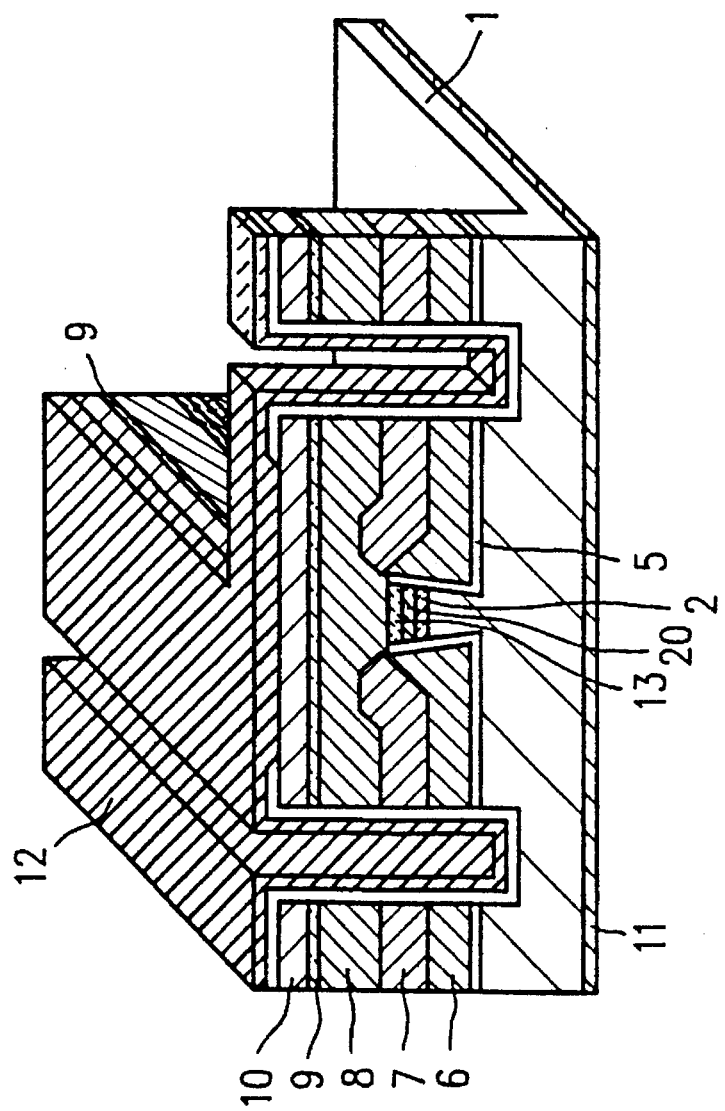

SEE FIG.15B

SEMICONDUCTOR LASER AND METHOD FOR PRODUCING THE SAME

BACKGROUND OF THE INVENTION

1. Field of the Invention

The present invention relates to a semiconductor laser and a method for producing the semiconductor laser. More particularly, the present invention relates to a semiconductor laser suitable for optical fiber communication and the like, and a method for producing such a semiconductor laser.

2. Description of the Related Art

In order to improve the production yield of semiconductor lasers, a technique for growing a current blocking layer in addition to an active layer on a substrate by MOVPE (metal organic vapor phase epitaxy) has been studied. A semiconductor laser in which all semiconductor layers required for the semiconductor laser are grown on an InP single crystalline substrate by MOVPE has been reported. See the Journal of Crystal Growth 93 (1988) 792 A. W. Nelson et al.

Referring to FIG. 18, the conventional semiconductor laser is described. In FIG. 18, on a substrate 50, an InP buffer layer 51, an active layer 52, a p-InP first current blocking layer 53, an n-InP second current blocking layer 54, a p-InP third current blocking layer 55, and a contact layer 56 are formed. On the top face of the substrate 50, a p-side electrode 57 is formed. On the back face of the substrate 50, an n-side electrode 58 is formed. In this semiconductor laser, a current injected from the p-side electrode 58 is confined by the second current blocking layer 54 and then injected into the active layer 52.

In order to enhance the performance of semiconductor lasers, the study and development of semiconductor lasers having a single quantum well (SQW) structure and a multiquantum well (MQW) structure are actively pursued. The semiconductor laser having a quantum well type active layer can attain superior effects due to the quantum size effect of the active layer, as compared with a semiconductor laser having a bulk type active layer. For example, due to an increase of the differential coefficient, a reduction of TM light-emission, and the like, the semiconductor laser oscillates at a low threshold level, so that a large light output can be obtained with high efficiency. In addition, due to an increase of the attenuation oscillating frequency and a reduction of the amplitude increasing coefficient, the response speed is increased and the chirping is reduced.

In order to further increase the differential coefficient, a "graded doped structure" is proposed. In the graded doped structure, p-type impurities are doped in a part of the barrier layer. Especially when a strained quantum well type active layer has the graded doped structure, the performance of the semiconductor laser is expected to be improved.

FIG. 19 shows a semiconductor laser provided with a quantum well type active layer having the conventional graded doped structure (K. Uomi, T. Mishima, N. Chinione, Jpn. J. Appl. Phys., 29(1990)88). In the semiconductor laser shown in FIG. 19, on a GaAs substrate 61, an n-type GaAs buffer layer 62, an n-type InAlAs cladding layer 63, a graded doped quantum well layer 68 which is sandwiched between non-doped GRIN-GaAlAs layers 64, a p-type GaAlAs cladding layer 69, an n-type GaAs current blocking layer 70, an oxide film 71, and a p-side electrode 73 are successively deposited in this order. The oxide film 71 is provided with a stripe-shaped opening. The p-side electrode 73 is in contact with a part of the n-type GaAs current blocking layer 70 through the opening. At the contact portion, a Zn diffused region 72 extending to the p-type GaAlAs cladding layer 69 is provided. On the back side of the substrate 61, an n-side electrode 74 is provided.

In the above-described conventional semiconductor laser (FIG. 18), it is confirmed by a long-term high-temperature and acceleration test (FIG. 20) that the driving current required for obtaining a predetermined light output level is not varied but stable. However, in an initial stage of the test, an increase of driving current caused by the increase of the threshold level of laser oscillation is observed. When a semiconductor laser is intended for practical use, the increase of the driving current must be avoided even in the initial stage.

In the case where a current blocking layer is formed by LPE (liquid phase epitaxy), a method for suppressing the increase of the threshold level is established. On the other hand, in the case of the MOVPE, there still exists the problem that the threshold current is increased.

In addition, the conventional semiconductor laser having a quantum well type active layer with a graded doped structure (FIG. 19) involves a problem in that the performance thereof is not so much improved, as compared with the case without the graded doped structure. This is because in the crystal growth after the step of forming the graded doped structure, the dopant is disadvantageously diffused from the semiconductor layer which is grown thereon to the active layer. Thus, the graded doped structure disappears.

SUMMARY OF THE INVENTION

The semiconductor laser of this invention includes: a semiconductor substrate of a first conductivity type; a stripe-shaped multilayer structure, formed on the semiconductor substrate, the stripe-shaped multilayer structure including an active layer; and a current blocking portion formed on the semiconductor substrate on both sides of the stripe-shaped multilayer structure, wherein the current blocking portion has a first current blocking layer of a second conductivity type, and a second current blocking layer of the first conductivity type formed on the first current blocking layer, the first current blocking layer includes a low-concentration region having a relatively low concentration of an impurity of the second conductivity type, and a high-concentration region having an impurity concentration which is higher than that of the low-concentration region, and the low-concentration region is provided at a position closer to the stripe-shaped multilayer structure than the high-concentration region.

In one embodiment of the invention, the first and the second current blocking layers are deposited by organic metal vapor phase epitaxy.

In another embodiment of the invention, the low-concentration region of the first current blocking layer has a thickness which becomes thinner toward the stripe-shaped multilayer structure.

In another embodiment of the invention, the impurity concentration of the high-concentration region of the first current blocking layer is $2\times10^{18}$ cm$^{-3}$ or less, and a concentration of an impurity of the first conductivity type of the second current blocking layer is $1\times10^{18}$ cm$^{-3}$ or more.

In another embodiment of the invention, a side face of the stripe-shaped multilayer structure is a crystal plane including a {111}P plane.

In another embodiment of the invention, the semiconductor laser further includes an undoped semiconductor layer provided between the current blocking portion and a surface of the semiconductor substrate and the side face of the stripe-shaped multilayer structure.

In another embodiment of the invention, the active layer has a multiquantum well structure.

In another embodiment of the invention, the semiconductor laser further includes a semiconductor layer of the second conductivity type which covers both the stripe-shaped multilayer structure and the current blocking portion, the semiconductor layer having a bandgap different from that of the current blocking portion.

According to another aspect of the invention, the semiconductor laser includes: a semiconductor substrate of a first conductivity type; a stripe-shaped multilayer structure, formed on the semiconductor substrate, the stripe-shaped multilayer structure including an active layer; and a current blocking portion formed on the semiconductor substrate on both sides of the stripe-shaped multilayer structure, wherein the current blocking portion has a first current blocking layer of a second conductivity type, and a second current blocking layer of the first conductivity type formed on the first current blocking layer, and one of two end portions of the second current blocking layer which is closer to the stripe-shaped multilayer structure has an apex angle of 60 degrees or more.

In one embodiment of the invention, a concentration of an impurity of the second conductivity type of the first current blocking layer is $1 \times 10^{18}$ cm$^{-3}$ or less, and a concentration of an impurity of the first conductivity type of the second current blocking layer is $1 \times 10^{18}$ cm$^{-3}$ or more.

In another embodiment of the invention, a side face of the stripe-shaped multilayer structure is a crystal plane including a {111}In plane.

In another embodiment of the invention, the semiconductor laser further includes an undoped semiconductor layer provided between the current blocking portion and a surface of the semiconductor substrate and the side face of the stripe-shaped multilayer structure.

In another embodiment of the invention, one of two end portions of the second current blocking layer which is closer to the stripe-shaped multilayer structure has an apex angle of 80 degrees or more.

In another embodiment of the invention, the active layer has a multiquantum well structure.

In another embodiment of the invention, the semiconductor laser further includes a semiconductor layer of the second conductivity type which covers both the stripe-shaped multilayer structure and the current blocking portion, the semiconductor layer having a bandgap different from that of the current blocking portion.

According to another aspect of the invention, a method for producing a semiconductor laser comprising: a semiconductor substrate of a first conductivity type; a stripe-shaped multilayer structure, formed on the semiconductor substrate, the stripe-shaped multilayer structure including an active layer; and a current blocking portion formed on the semiconductor substrate on both sides of the stripe-shaped multilayer structure is provided. The method includes the steps of: depositing a plurality of semiconductor layers including the active layer on the semiconductor substrate; forming, on the semiconductor layers, a cap layer having an etching characteristic different from an etching characteristic of the semiconductor layers; forming a stripe-shaped mask layer on the cap layer; selectively etching the cap layer and the semiconductor layer using an etchant to form the stripe-shaped multilayer structure having a width narrower than that of the cap layer, the etchant substantially not etching the mask layer, but preferentially etching the cap layer to the semiconductor layer; and forming the current blocking portion.

In one embodiment of the invention, a width of the stripe-shaped mask layer is twice or more as large as the width of the stripe-shaped multilayer structure.

In another embodiment of the invention, in the etching step, a part of the etchant is entered between the stripe-shaped mask layer and the cap layer.

In another embodiment of the invention, the step of forming the cap layer includes a step of forming the cap layer from InGaAsP crystal, and the etching step includes a first etching step using an acetic acid type etchant and a second etching step using a chloric acid type etchant.

In another embodiment of the invention, the step of forming the current blocking portion includes a step of epitaxially growing the current blocking portion at a growth temperature of 600° C. or more by organic metal vapor phase epitaxy.

In another embodiment of the invention, the step of forming the current blocking portion includes a step of heating said semiconductor substrate to the growth temperature in an atmosphere including an element of group V of the active layer.

According to another aspect of the invention, a method for producing a semiconductor laser comprising: a semiconductor substrate of a first conductivity type; a stripe-shaped multilayer structure, formed on the semiconductor substrate, the stripe-shaped multilayer structure including an active layer; and a current blocking portion formed on the semiconductor substrate on both sides of the stripe-shaped multilayer structure is provided. The method includes the steps of: depositing a plurality of semiconductor layers including the active layer on the semiconductor substrate; forming a stripe-shaped mask layer on the semiconductor substrate; selectively etching the semiconductor layer using an etchant to form the stripe-shaped multilayer structure, the etchant substantially not etching the mask layer; growing a first current blocking layer of a second conductivity type on the semiconductor substrate; and growing a second current blocking layer of the first conductivity type on the first current blocking layer, one of end portions of the second current blocking layer closer to the stripe-shaped multilayer structure having an apex angle of 60 degrees or more.

In another embodiment of the invention, the first and the second current blocking layers are epitaxially grown at a growth temperature of 600° C. or more by organic metal vapor phase epitaxy.

In another embodiment of the invention, the production method further includes a step of epitaxially growing an undoped semiconductor layer, prior to the formation of the first and second current blocking layer.

According to another aspect of the invention, a semiconductor laser includes: a semiconductor substrate of a first conductivity type; a stripe-shaped multilayer structure including a quantum well type active layer having a graded doped structure formed on the semiconductor substrate; a current blocking portion formed on both sides of the stripe-shaped multilayer structure, for confining a current in the stripe-shaped multilayer structure; and a semiconductor layer of a second conductivity type formed above the stripe-shaped multilayer structure and the current blocking portion, wherein the semiconductor laser further includes a diffusion suppressing layer covering both the stripe-shaped multilayer structure and the current blocking portion for suppressing an impurity included in the semiconductor layer of the second conductivity type from diffusing into the active layer, the diffusion suppressing layer having a bandgap which is smaller than that of the current blocking portion.

In one embodiment of the invention, the diffusion suppressing layer has a solid solubility larger than that of the semiconductor layer of the second conductivity type with respect to the impurity doped in the semiconductor layer of the second conductivity type.

In another embodiment of the invention, the current blocking portion is formed of InP, the semiconductor layer of the second conductivity type is formed of Zn-doped InP, and the diffusion suppressing layer is formed of InGaAsP.

In another embodiment of the invention, the stripe-shaped multilayer structure includes a waveguide layer having a solid solubility larger than that of the semiconductor layer of the second conductivity type with respect to the impurity doped in the semiconductor layer of the second conductivity type, the waveguide layer being provided between the active layer and the diffusion suppressing layer.

According to another aspect of the invention, a method for producing a semiconductor laser includes the steps of: growing, on a semiconductor substrate of a first conductivity type, a multilayer structure including a quantum well type active layer having a graded doped structure; etching the multilayer structure to form a stripe-shaped multilayer structure; growing a current blocking portion on both sides of the stripe-shaped multilayer structure for confining a current in the stripe-shaped multilayer structure; forming a diffusion suppressing layer on the stripe-shaped multilayer structure and the current blocking portion, the diffusion suppressing layer having a bandgap smaller than that of the current blocking portion; and growing a semiconductor layer of a second conductivity type on the diffusion suppressing layer.

Thus, the invention described herein makes possible the advantages of (1) providing a semiconductor laser with high reliability in which current leakage is reduced, and a method for producing the semiconductor laser, and (2) providing a semiconductor laser in which current leakage is reduced and the graded doped structure is prevented from disappearing during the production process, and a method for producing the semiconductor laser.

These and other advantages of the present invention will become apparent to those skilled in the art upon reading and understanding the following detailed description with reference to the accompanying figures.

BRIEF DESCRIPTION OF THE DRAWINGS

FIG. 1A is a cross-sectional view of a semiconductor laser according to the invention, and FIG. 1B is an energy diagram showing an active layer of the semiconductor laser.

FIG. 6A is a cross-sectional view of a semiconductor laser according to the invention, and FIG. 6B is an energy diagram showing an active layer of the semiconductor laser.

DESCRIPTION OF THE PREFERRED EMBODIMENTS

EXAMPLE 1

Figure 2A:
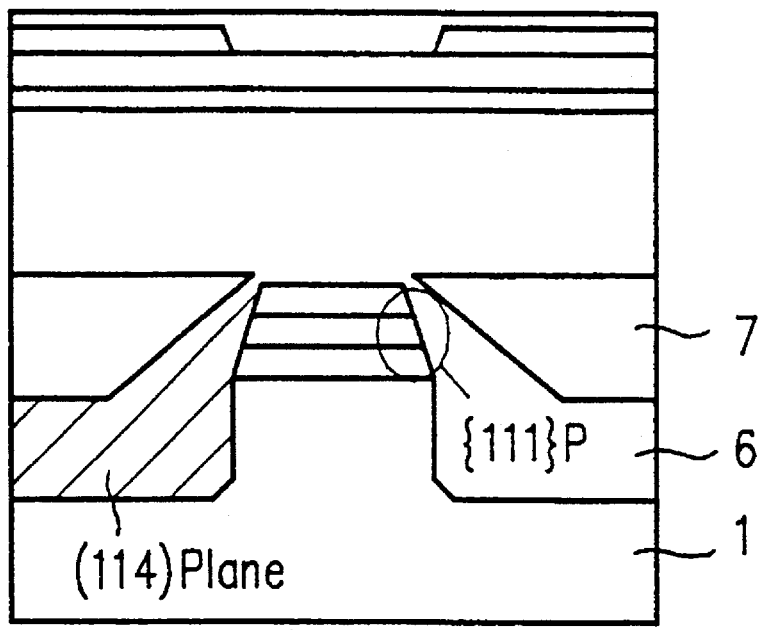
FIG. 2A is a cross-sectional view showing the main portions of the semiconductor laser shown in FIG. 1A.

Hereinafter, a first example of a semiconductor laser according to the invention will be described with reference to FIGS. 1A and 1B.

First, referring to FIG. 1A, the semiconductor laser in this example uses an Sn-doped n-InP substrate 1 having a top face on which a stripe-shaped ridge is formed. On the ridge of the n-InP substrate 1, a stripe-shaped multilayer structure is formed. On the n-InP substrate 1 on both sides of the stripe-shaped multilayer structure, a current blocking portion provided with a stripe-shaped groove is formed. The groove reduces the parasitic capacitance and improves the high-frequency characteristics of the semiconductor laser.

The stripe-shaped multi-layer structure includes an n-InGaAsP waveguide layer 2 having a thickness of 150 nm, an active layer 20, and an n-InGaAsP cladding layer (waveguide layer) 13 in this order from the substrate 1. As shown in FIG. 1B, the active layer 20 has a multiquantum well structure including InGaAsP well layers 3 each having a thickness of 4 nm and InGaAsP (λg=1.15 μm) barrier layers 4 each having a thickness of 10 nm. The number of quantum well layers is 7, and the cavity length is 300 μm.

The current blocking portion includes a Zn-doped p-InP first current blocking layer (thickness: about 1 μm) 6, and an Si-doped n-InP second current blocking layer (thickness: about 1 μm) 7 in this order from the substrate 1. Between the p-InP first current blocking layer 6 and the substrate 1, an undoped InP layer 5 having a thickness of 10 nm is interposed. On the n-InP second current blocking layer 7, a Zn-doped p-InP third current blocking layer (thickness: about 4 μm) 8 is formed. The p-InP third current blocking layer 8 also covers the upper face of the stripe-shaped multi-layer structure. The relatively thick p-InP third current blocking layer 8 may alternatively have a two-layer structure. More preferably, the p-InP third Current blocking layer 8 may be formed by a lower layer having a relatively low Zn concentration (e.g., the Zn concentration is equal to or lower than $1 \times 10^{18}$ cm$^{-3}$) and an upper layer having a relatively high Zn concentration (e.g., the Zn concentration is equal to or higher than $1 \times 10^{18}$ cm$^{-3}$).

On the p-InP third current blocking layer 8, a p-InGaAsP barrier reducing layer 9 for suppressing the Schottky barrier, a p-GaInAs contact layer 10 for forming an ohmic contact, and a p-side electrode 12 made of Au/Zn are formed. On the back face of the substrate 1, an n-side electrode 11 made of Au/Sn is formed.

FIG. 2A shows the shape of the n-InP second current blocking layers 6 and 7 and the shape of the stripe-shaped multilayer structure of the semiconductor laser in this example in more detail. The side face of the stripe-shaped multi-layer structure is a {111}P plane which is stable and on which the crystal growth is easily performed as compared with a {111}In plane. As described later, in order to form the stripe-shaped multi-layer structure having the {111}P plane as the side face thereof, for example, InGaAsP crystal is used as the material for the cap layer (represented by "14" in FIG. 3A) and etching is performed by using acetic acid type etchant. Thereafter, etching is performed again by using hydrochloric acid type etchant, so as to adjust the stripe height. The side face of the stripe-shaped multi-layer structure may be a {111}In plane. Especially, if any damage occurring on the side face of the active layer is suppressed by lowering the Zn concentration of the p-InP first current blocking layer or the like, good characteristics can be obtained, even in the case of the {111}In plane.

The thickness of the p-InP first current blocking layer 6 is made thinner in the vicinity of the stripe-shaped multi-layer structure. The upper face of the thinner portion of the p-InP first current blocking layer 6 is a (114) plane. The p-InP first current blocking layer 6 includes a low-concentration region with a relatively low concentration of Zn which is an impurity of p-type conductivity, and a high-concentration region with a Zn concentration higher than that of the low-concentration region. The low-concentration region is disposed at a position closer to the stripe-shaped multi-layer structure than the high-concentration region (i.e., in the thinner portion). In other words, the Zn concentration of the p-InP first current blocking layer 6 is relatively lower in the vicinity of the active layer 20 (in a region away from the active layer 20 only by several micrometers). When the p-InP first current blocking layer 6 is grown by a conventional crystal growth method, the Zn concentration in the vicinity of the active layer 20 (in the region away from the active layer 20 only by several micrometers) is rather higher than that of the flat portion. In other words, the p-InP first current blocking layer 6 having the Zn concentration distribution of this example cannot be obtained by a conventional production method.

The lower Zn concentration reduces the influence of Zn on the active layer 20. Herein, the phrase "the influence of Zn on the active layer" indicates a phenomenon in that Zn forms a defect as a non-emitting center in the active layer or at the interface between the active layer and the first current blocking layer. The reduction of the influence of Zn on the active layer can increase the light output and reduce the threshold current level, and can also provide high reliability. In the case where the active layer has the graded doped structure, the diffusion of Zn may destroy the graded doped structure, which is included in "the influence of Zn on the active layer". This influence will be described later in a third example.

In this example, the Zn concentration is relatively lowered in the vicinity of the active layer 20, but the Zn concentration of the flat portion (the high concentration region) away from the active layer 20 is relatively high. In this way, when the Zn concentration of the flat portion (the high-concentration region) away from the active layer 20 is made higher than usual, the influence of Zn on the active layer can be reduced. By increasing the Zn concentration of the flat portion (the high-concentration region) of the p-InP first current blocking layer 6, the thyristor current can be increased, and it is possible to realize a semiconductor laser with high output level.

The n-InP second current blocking layer 7 positioned over the p-InP first current blocking layer 6 has a substantially flat upper surface. In order to suppress the leakage current, the n-InP second current blocking layer 7 preferably has a large thickness. However, the n-InP second current blocking layer 7 in this example is made thinner in the vicinity of the stripe-shaped multilayer structure, and the angle at the end thereof is acute (e.g., 40 degrees).

Hereinafter, the operation of the semiconductor laser will be described with reference to FIG. 1A.

In order to attain the laser oscillation, it is necessary to sufficiently invert the carrier distribution in the active layer 20 by causing a driving current at a predetermined value (the threshold value) or more to flow between the p-side electrode 12 and the n-side electrode 11. In order to obtain a high light output level at a low threshold value, the current flowing between the p-side electrode 12 and the n-side electrode 11 is confined in the stripe-shaped multilayer structure by the current blocking portion in this example.

As the result of the evaluation of the semiconductor laser of this example, it is found that the semiconductor laser shown in FIG. 1A stably performs the laser oscillation at a driving current of 20 mA (the oscillation threshold value: 20 mA). The oscillation threshold value is substantially equal to the oscillation threshold value of a semiconductor laser in which the burying layer is grown by LPE. Also, as the result of the evaluation on the reliability by an acceleration test (70° C., 150 mA, 100 hr), it is found that the variation of the threshold value is substantially 0%.

These evaluated results shows that the diffusion of Zn into the active layer is suppressed in the semiconductor laser of this example. The diffusion of Zn into the active layer is suppressed because the Zn concentration of the p-InP first current blocking layer 6 is relatively low in the vicinity of the active layer 20. If the Zn concentration of the entire p-InP first current blocking layer 6 is lowered in order to suppress the diffusion of Zn into the active layer, a thyristor operation is caused by the p-InP first current blocking layer 6, the n-InP second current blocking layer 7, and the p-InP third current blocking layer 8 during the operation of the semiconductor laser, so that the output level of the laser light is disadvantageously lowered.

Figure 5:
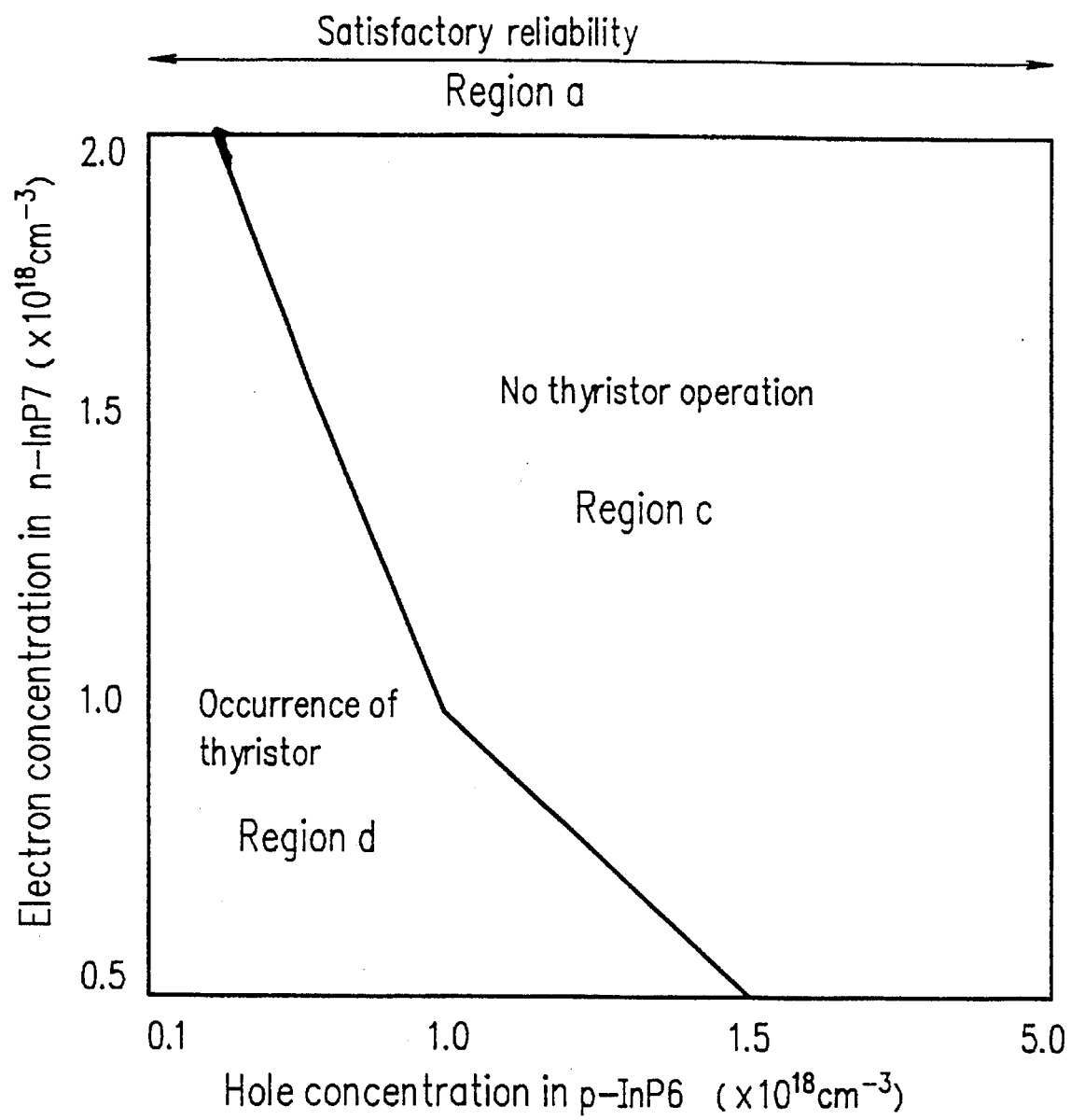
FIG. 5 is a graph showing the relationship between a carrier concentration of the current blocking layer and a thyristor operation in the semiconductor laser shown in FIG. 1A.

FIG. 5 shows the relationships between the dopant concentrations of the p-InP first current blocking layer 6 and the p-InP second current blocking layer 7 and the occurrence of the thyristor operation in the semiconductor laser shown in FIG. 1A. In FIG. 5, region a indicates a region with high reliability. Region c indicates a region in which the thyristor operation is not caused. Region d indicates a region in which the thyristor operation may be caused. The respective concentrations of the p-InP first current blocking layer 6 and the p-InP second current blocking layer 7 are preferably set in the region c. In this example, since the Zn concentration is lowered in the vicinity of the active layer 20, high reliability can be attained in the wide range shown in the figure. This is a different feature from the example which is described later (see FIG. 10).

Figure 3A:
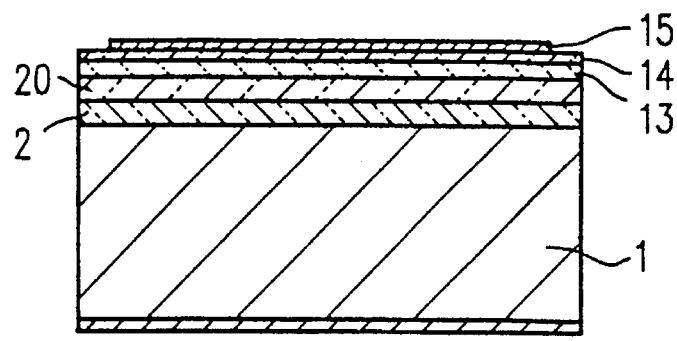
FIGS. 3A to 3C are cross-sectional views showing process steps of a method for producing the semiconductor laser shown in FIG. 1A.
Figure 3B:
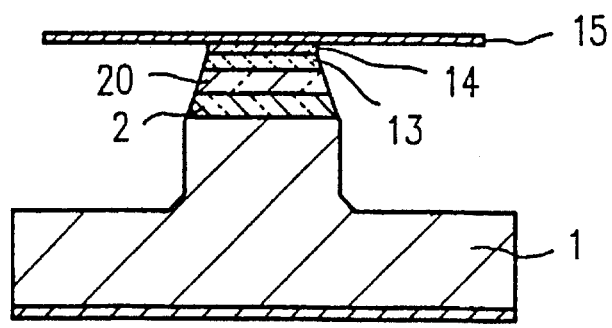
Figure 3C:
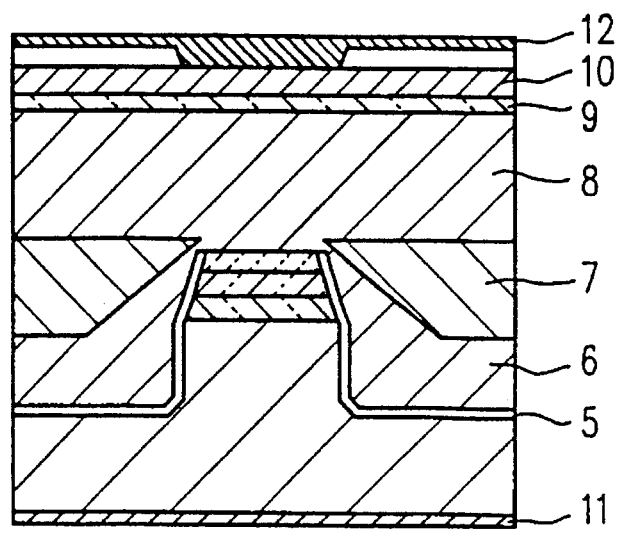

Next, referring to FIGS. 3A to 3C, the method for producing the semiconductor laser shown in FIG. 1A will be described.

First, on an Sn-doped InP substrate 1, an n-InGaAsP ($\lambda g=1.15$ μm) waveguide layer 2 is grown to have a thickness of 150 nm by MOVPE. Then, a $Ga_{0.1}In_{0.9}As_{0.5}P_{0.5}$ well layer 3 having a thickness of 4 nm, and a GaInAsP ($\lambda g=1.37$ μm) barrier layer 4 having a thickness of 10 nm are paired, and the pair of well layer 3 and barrier layer 4 is repeatedly grown seven times. Thus, a multilayer well type active layer having 7 pairs is obtained. Thereafter, a p-InP cladding layer 13 having a thickness of 400 nm and a p-InGaAsP ($\lambda g=1.3$ μm) cap layer 14 having a thickness of 100 nm are grown. The p-InP cladding layer 13 and the p-InGaAsP cap layer 14 have different etching characteristics from each other for at least one type of etchant.

Next, after a silicon nitride film (thickness: 50 to 300 nm) is deposited on the p-InGaAsP cap layer 14, the silicon nitride film is etched into a stripe shape by dry etching, so as to obtain a stripe-shaped silicon nitride film (width: about 3 to 6 μm) 15. Thereafter, the wafer from the p-InGaAsP cap layer 14 to the substrate 1 is etched by using an etchant which substantially does not etch the stripe-shaped silicon nitride film 15 but preferentially etches the p-InGaAsP cap layer 14. As for such an etchant, an acetic acid type etchant is used.

The adhesion between the p-InGaAsP cap layer 14 and the stripe-shaped silicon nitride film 15 is left to be relatively poor, the etching promptly progresses in a horizontal direction, and the semiconductor layer positioned directly under the stripe-shaped silicon nitride layer 15 is also etched. As a result, as shown in FIG. 3B, the stripe-shaped silicon nitride film 15 is overhung. Then, a predetermined region of the upper face of the substrate 1 is etched by a chloric acid type etchant. The total height of a stripe for adjusting the height of the stripe-shaped ridge formed on the upper face of the substrate 1 is set to be approximately 2 μm. The etching conditions are determined so that the width of the stripe-shaped ridge is in the range of 1 to 1.5 μm.

Next, by MOVPE, an undoped InP layer 5 and a p-InP first current blocking layer 6 and an n-InP second current blocking layer 7 are successively epitaxially grown. Then, the stripe-shaped silicon nitride film 15 and the cap layer 14 are removed, and a p-InP third current blocking layer 8, a p-GaInAsP barrier reducing layer 9 and a p-GaInAs contact layer 10 are grown by MOVPE. Thereafter, an n-side electrode 11 and a p-side electrode 12 are vapor deposited, so as to obtain the structure shown in FIG. 3C.

Figure 13:
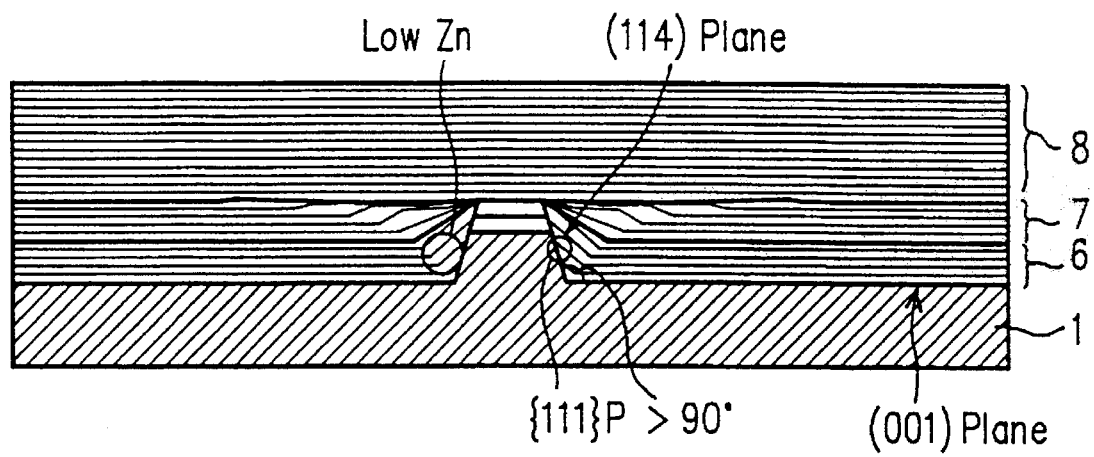
FIG. 13 is a cross-sectional view showing the growth of a current blocking layer of the semiconductor laser shown in FIG. 1A.

FIG. 13 is a cross-sectional view which schematically shows the growth of the p-InP first current blocking layer 6, the n-InP second current blocking layer 7, and the p-InP third current blocking layer 8. In this example, the side face of the ridge provided on the substrate is constituted by a plane including a {111}P plane. The side face of the ridge and the upper face of the substrate, i.e., a (001) plane form an angle which exceeds 90 degrees. In the vicinity of the ridge, a face on which the p-InP first current blocking layer is grown is constituted by a plane from a (112) plane to a (114) plane. When the growth face is the (114) plane, dangling bonds are not likely to be formed in the grown layer, and hence less impurities are taken therein, as compared with the case where the growth face is a {111} plane.

Figure 4:
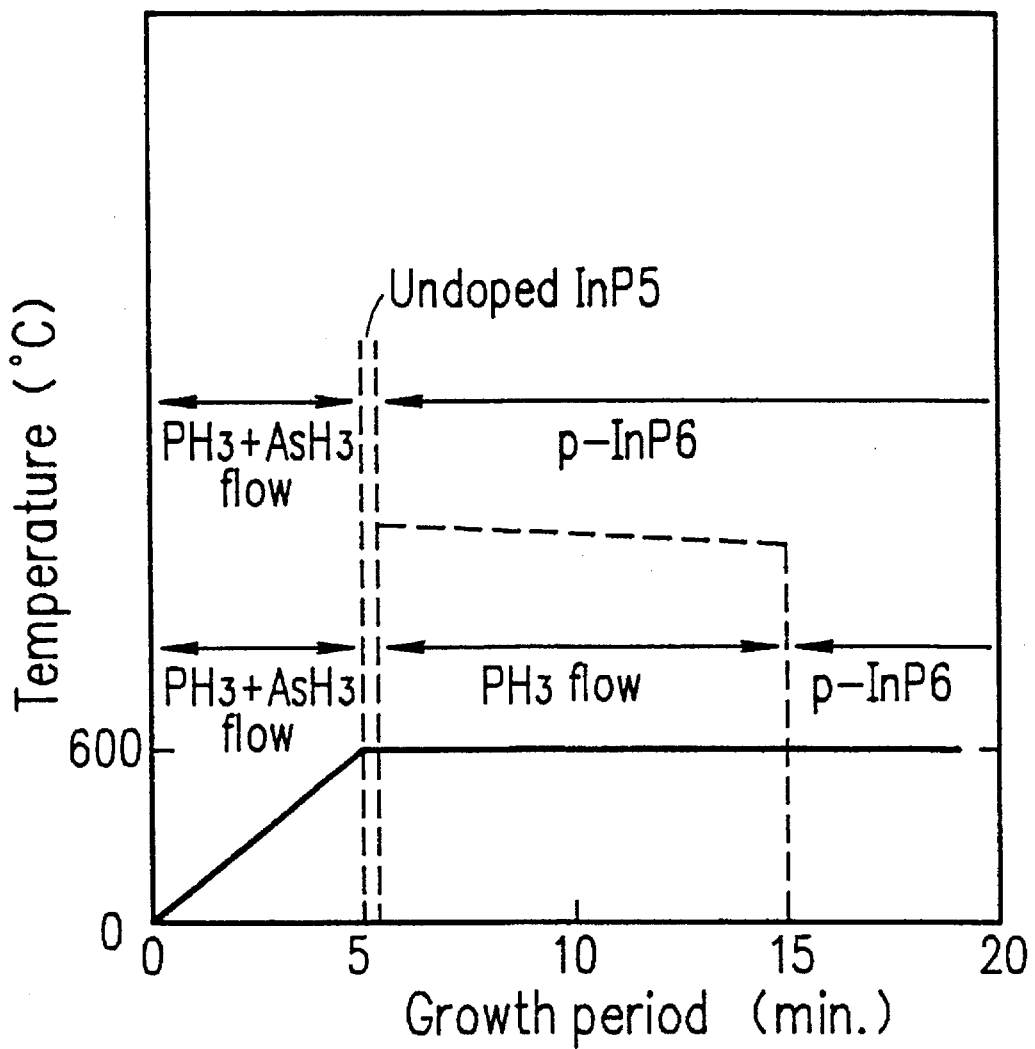
FIG. 4 is a graph for illustrating the process prior to the step of growing a current blocking layer.

Hereinafter, referring to FIG. 4, the formation step of the p-InP first current blocking layer 6 and the like is described in detail. -FIG. 4 is a graph showing the growth conditions of the p-InP first current cladding layer 6. The vertical axis of the graph indicates the temperature (Celsius scale) of a heater for heating the substrate 1 in an MOVPE apparatus, and the horizontal axis indicates the time (minutes) measured from the start of the heating by the heater. In the example shown in FIG. 4, after about 5 minutes from the start of the heating, the heater temperature reaches 600° C. Thereafter, the heater temperature is maintained at 600° C. The actual temperature of the substrate 1 does not reach 600° C. after 5 minutes from the start of the heating. The actual temperature of the substrate 1 becomes steady after about several minutes from the time when the heater temperature becomes steady.

In this example, during the temperature rise for 5 minutes, the substrate 1 is exposed to a mixed atmosphere of $PH_3$ and $AsH_3$ in the chamber of the MOVPE apparatus. When 5 minutes elapse from the start of the heating, the growth of the undoped InP layer 5 is immediately started. Then, the P-InP layer 6 is grown. In general, there is a risk that the following problem occurs when the p-InP layer 6 is successively formed after the growth of the undoped InP layer 5 in this example. That is, during the growth of the undoped InP layer 5, the temperature of the substrate 1 has not yet sufficiently risen. Accordingly, the growth of the p-InP layer 6 is started while the growth of the undoped InP layer 5 is not complete. If the growth of the undoped InP layer 5 is not complete, the side face of the active layer is not sufficiently covered with the undoped InP layer 5. In such a case, if the dopant (Zn) is contained in the p-InP layer 6 with a high concentration, the excessive dopant passes through the undoped InP layer 5 and reaches the active layer. This causes damages in the side face of the active layer. In the portion of the p-InP first current blocking layer 6 in the vicinity of the active layer 20 in this example, the Zn concentration is relatively low, so that there is little fear that the excessive dopant passes through the undoped InP layer 5 and reaches the active layer. In this example, it is possible to grow the p-InP layer 6 immediately after the growth of the undoped InP layer 5, so that the time required for the growth step can be shortened.

As described above, in the case where the atmosphere gas flow rate during the temperature rises before the InP growth is made similar to that of the group V element during the growth of the active layer, the elimination of the group V element from the active layer 20 is suppressed. In addition, in the case where the undoped layer is formed before the growth of the first current blocking layer, the dopant in the first current blocking layer can be prevented from condensing at the interface with the active layer 20.

In general, the group III element and dopant reaching the silicon nitride film 15 during the crystal growth are diffused on the silicon nitride film 15 in the horizontal direction, and contribute to the crystal growth around the silicon nitride film 15. Therefore, the crystal growth rate of the p-InP layer 6 is usually increased in the vicinity of the side face of the stripe-shaped ridge, and the dopant concentration is increased. However, in this example, the overhung silicon nitride film 15 suppresses the supply of the group III element and dopant to the side face of the stripe-shaped ridge due to the mask function thereof. As a result, the portion of the p-InP layer 6 below the overhung silicon nitride layer 15 is relatively thin, and has a lower dopant concentration. In the p-InP layer 6, the reduction of the thickness and the lowering of the dopant concentration are more remarkable toward the side face of the stripe-shaped ridge below the overhung silicon nitride film 15. Therefore, even if the dopant concentration of the flat portion of the p-InP layer 6 is made higher in order to suppress the thyristor current, the dopant concentration is lowered in the vicinity of the active layer, and the limit of solid solubility cannot be exceeded. Therefore, it is possible to make the dopant concentration of the flat portion sufficiently high.

As shown in FIG. 4, the crystal growth of the p-InP layer 6 is performed at 600° C. At temperatures lower than 600° C., the crystal around the mask of the n-InP layer 7 may be abnormally grown. If the growth temperature is 560° C. or less, the selectivity of the growth (orientation dependence) may be deteriorated. In addition, if the growth temperature is 560° C. or less, the dependence of the Zn concentration on temperature is increased, so that the dopant concentration in the grown semiconductor layer is not stable. Therefore, it is preferred that the growth temperature is set to be 600° C. or more.

The respective flow rates of $PH_3$ and $AsH_3$ are set to be equal to those in the case where the waveguide layer 2 is grown. In another case where only $PH_3$ is supplied and the undoped InP layer is not inserted, the threshold current is increased so as to be double.

EXAMPLE 2

Hereinafter, referring to FIGS. 6A and 6B, another example of a semiconductor laser according to the invention will be described.

First, referring to FIG. 6A, the semiconductor laser in this example uses an Sn-doped InP substrate 1 having a top face on which a stripe-shaped ridge is formed. On the ridge of the Sn-doped InP substrate 1, a stripe-shaped multilayer structure is formed. On the Sn-doped InP substrate 1 on both sides of the stripe-shaped multilayer structure, a current blocking potion provided with a stripe-shaped groove is formed, similar to the example shown in FIG. 1A.

The stripe-shaped multi-layer structure includes an n-InGaAsP waveguide layer 2 having a thickness of 150 nm, an active layer 20, and a cladding layer 13 in this order from the substrate 1. As shown in FIG. 6B, the active layer 20 has a multiquantum well structure including InGaAsP well layers 3 each having a thickness of 4 nm and InGaAsP ($\lambda g=1.15$ μm) barrier layers 4 each having a thickness of 10 nm. The number of quantum well layers is 7, and the cavity length is 300 μm.

The current blocking portion includes a Zn-doped p-InP first current blocking layer (thickness: about 1 μm) 6, and an Si-doped n-InP second current blocking layer (thickness: about 1 μm) 7 in this order from the substrate 1. Between the p-InP first current blocking layer 6 and the substrate 1, an undoped InP layer 5 having a thickness of 10 nm is interposed. On the n-InP second current blocking layer 7, a Zn-doped p-InP third current blocking layer (thickness: about 4 μm) 8 is formed. The p-InP third current blocking layer 8 also covers the upper face of the stripe-shaped multi-layer structure. The relatively thick p-InP third current blocking layer 8 may alternatively have a two-layer structure. Preferably, the p-InP third current blocking layer 8 may be formed by a lower layer having a relatively low Zn concentration (e.g., the Zn concentration is lower than $1\times10^{18}$ $cm^{-3}$) and an upper layer having a relatively high Zn concentration (e.g., the Zn concentration is higher than $1\times10^{18}$ $cm^{-3}$).

On the p-InP third current blocking layer 8, a p-InGaAsP barrier reducing layer 9 for suppressing the Schottky barrier, a p-GaInAs contact layer 10 for forming an ohmic contact, and a p-side electrode 12 made of Au/Zn are formed. On the back face of the substrate 1, an n-side electrode 11 made of Au/Sn is formed.

Figure 2B:
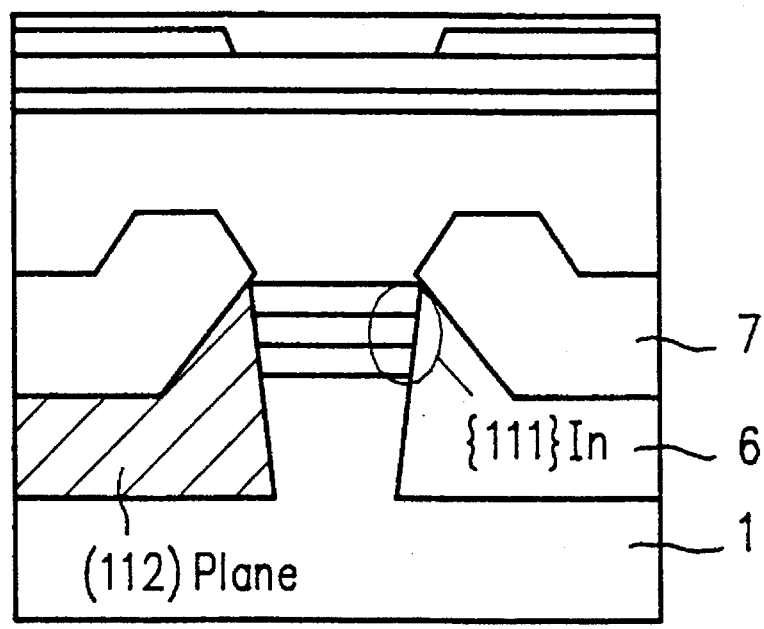
FIG. 2B is a cross-sectional view showing the main portions of another semiconductor laser according to the invention.

FIG. 2B shows the shape of the n-InP second current blocking layer 7 and the shape of the stripe-shaped multi-layer structure of the semiconductor laser in this example in more detail. The side face of the stripe-shaped multi-layer structure is a {111}In plane.

The n-InP second current blocking layer 7 has a substantially uniform thickness, but it is bent upwardly in the vicinity of the stripe-shaped multilayer film. This is because, when the n-InP second current blocking layer 7 is grown, the crystal growth rate is relatively increased in the vicinity of the stripe-shaped multilayer structure. As a result, as shown in FIG. 2B, the thickness of the portions of the n-InP second current blocking layer 7 in the vicinity of the stripe-shaped multilayer structure is approximately twice as large as that of the other portions.

The angle at the end portion of the n-InP second current blocking layer 7 in this example is 80 degrees or more. The relationship between the shape of the end portion of the n-InP second current blocking layer 7 and the leakage current will be described with reference to FIGS. 7A to 7D.

Figure 7A:
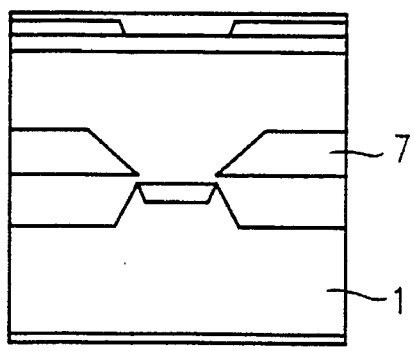
FIGS. 7A through 7D are diagrams schematically showing relationships between a shape of a current blocking layer in the vicinity of the active layer and a leakage current.
Figure 7B:
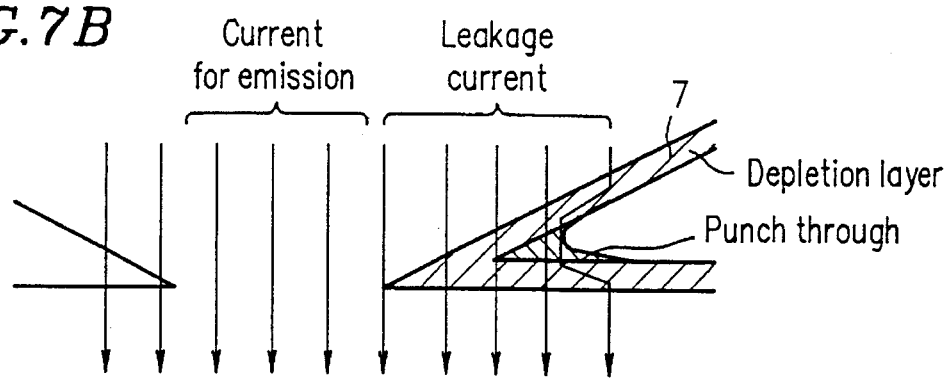

FIGS. 7A and 7B show a second current blocking layer in which the angle of the end portion thereof close to the active layer is 45 degrees or less. During the operation of the semiconductor laser, a depletion layer is formed in the second current blocking layer. The depletion layer extends from a PN junction which is formed by the second current blocking layer and a semiconductor layer of a different conductivity type which is in contact with the second current blocking layer. As the angle of the end portion of the second current blocking layer is made smaller, the end portion of the depletion layer is expanded horizontally. The depletion layer having the horizontally expanded end portion may leak a part of the driving current.

Figure 7C:
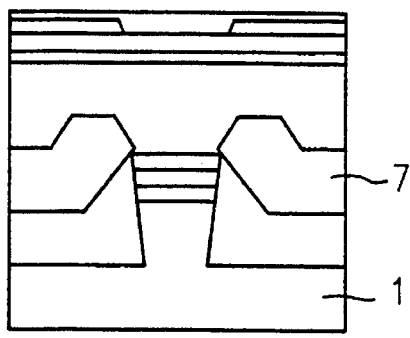
Figure 7D:
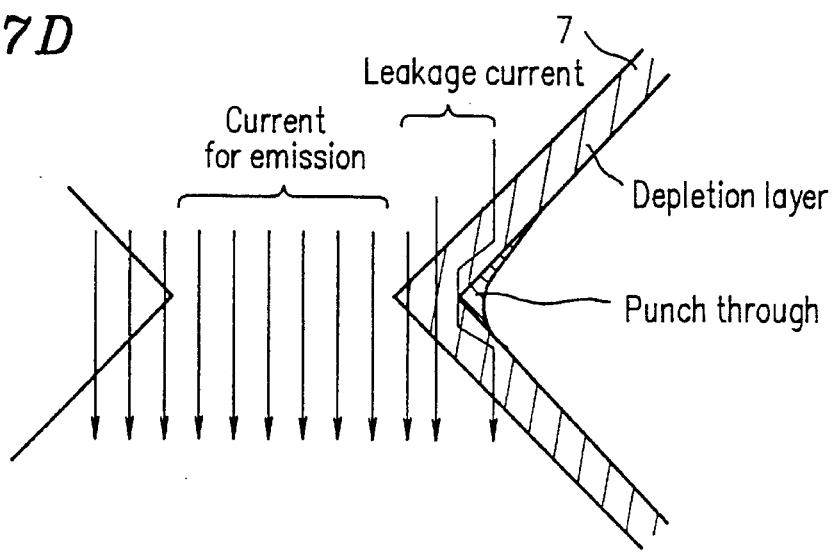

FIGS. 7C and 7D show a second current blocking layer in which the angle of the end portion in the vicinity of the active layer is about 90 degrees. In such a second current blocking layer, the depletion layer is not so expanded horizontally, even in the end portion thereof. Therefore, the end portion of the second current blocking layer relatively prevents the driving current from leaking.

In the example shown in FIG. 6A, the possible leakage current is reduced due to the contact of such depletion layers. When the leakage current is reduced, high light output level can be attained by a relatively small driving current. In addition, the linearity of the relationship between the light output and the driving current is improved, so that the modulation strain of the laser can be reduced.

As the result of the evaluation of the semiconductor laser of this example, it was found that the semiconductor laser stably performs the laser oscillation at a driving current of 20 mA (the oscillation threshold value: 20 mA). The oscillation threshold value is substantially equal to the oscillation threshold value of a semiconductor laser in which the burying layer is grown by LPE. The light output was increased to be 1.5 times to that of conventional case. Also, as the result of the evaluation on the reliability by an acceleration test (70° C., 150 mA, 100 hr), it was found that the variation of the threshold value is substantially 0%.

Figure 8:
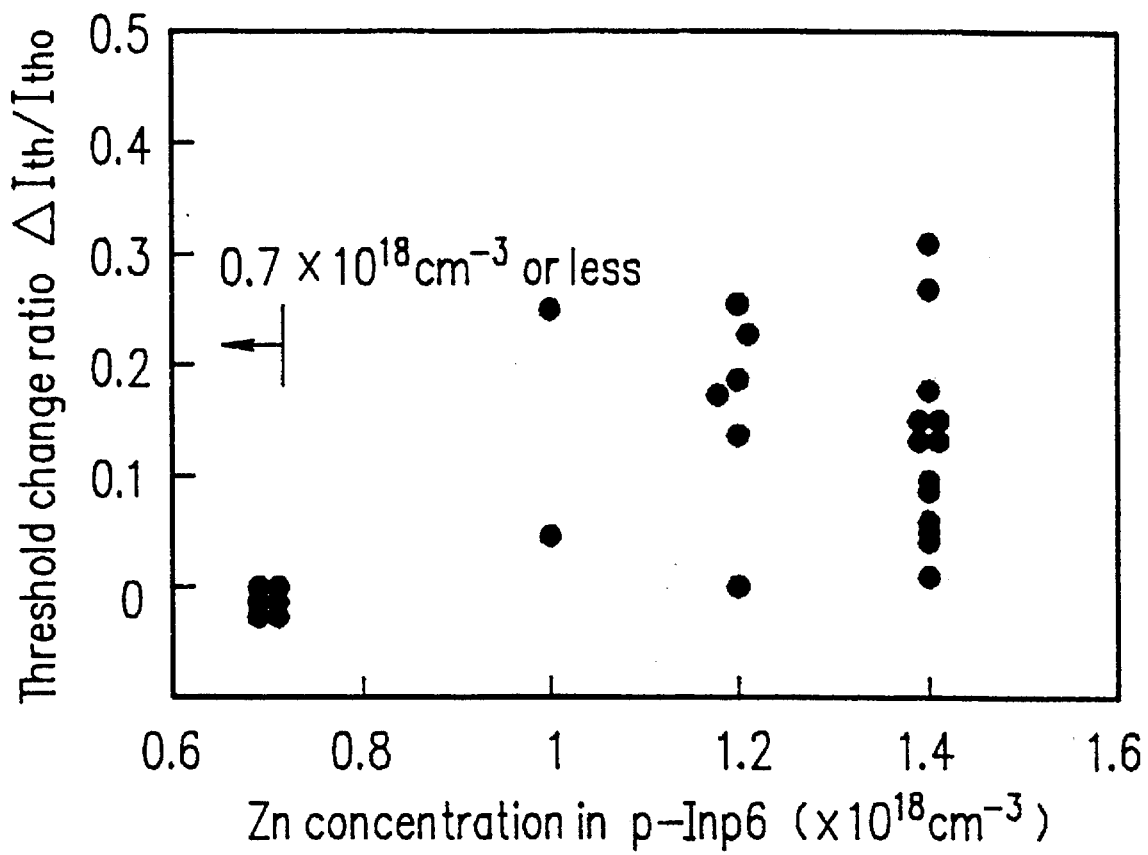
FIG. 8 is a diagram. showing a relationship between a Zn concentration of a first current blocking layer and a variation of a threshold current.

FIG. 8 shows the relationship between the variation ratio of the threshold current and the Zn concentration of the p-InP first current blocking layer 6. It is seen from FIG. 8 that when the Zn concentration of the p-InP first current blocking layer 6 becomes equal to $1.0 \times 10^{18}$ cm$^{-3}$ or more, the variation ratio of threshold current increases. It is considered that when the Zn concentration of the p-InP layer 6 exceeds $1.0 \times 10^{18}$ cm$^{-3}$, the Zn concentration in the vicinity of the side face of the active layer exceeds the solid solubility, and hence the threshold value is caused to vary. In order to set the variation ratio of threshold value to be 0%, it is preferred that the Zn concentration of the p-InP first current blocking layer 6 is made to be $0.7 \times 10^{18}$ cm$^{-3}$ or less.

Figure 9:
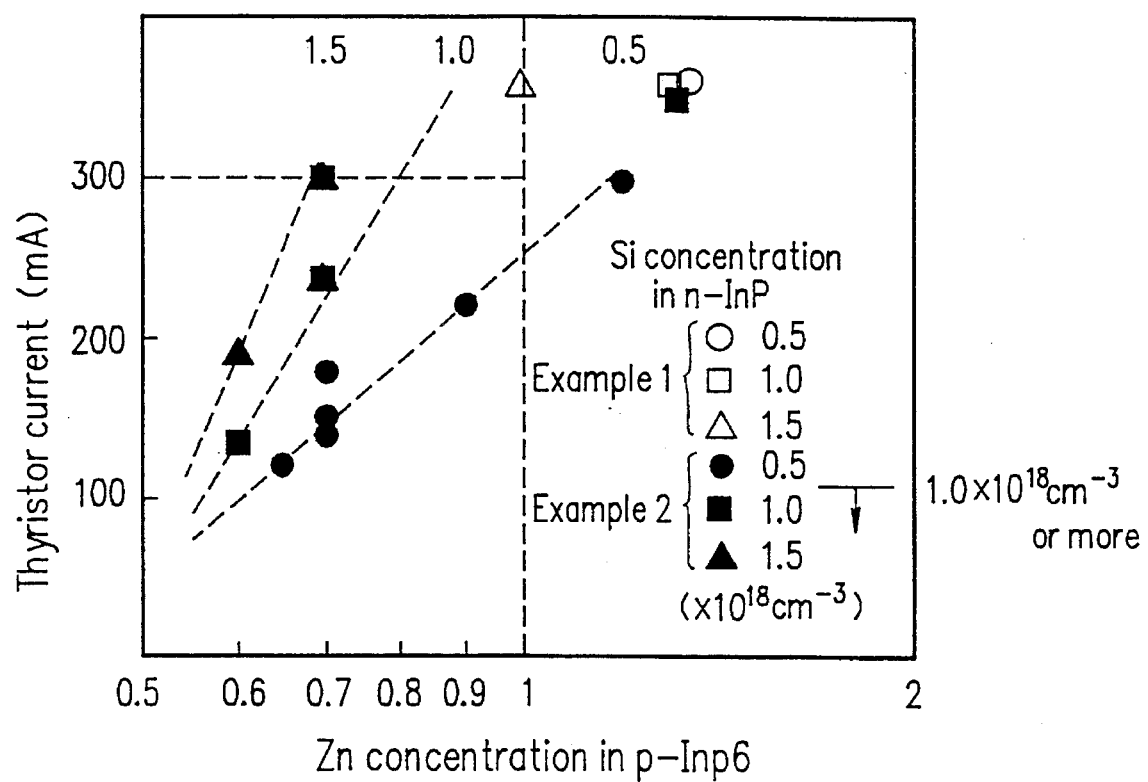
FIG. 9 is a diagram showing a thyristor current, a Zn concentration of a first current blocking layer, and an Si concentration dependence of a second current blocking layer.

FIG. 9 shows the relationship among the thyristor current (constituting an ineffective current), the Zn concentration of the p-InP first current blocking layer 6, and the Si concentration of the n-InP layer 7. It is seen from FIG. 9 that in order to reduce the thyristor current, it is preferred that the Si concentration of n-InP layer 7 is set to be $1 \times 10^{18}$ cm$^{-3}$ or more. By setting the impurity concentration in this range, the thyristor current is not generated at the driving current of 300 mA or less, and the characteristics suitable for practical use can be obtained.

Figure 10:
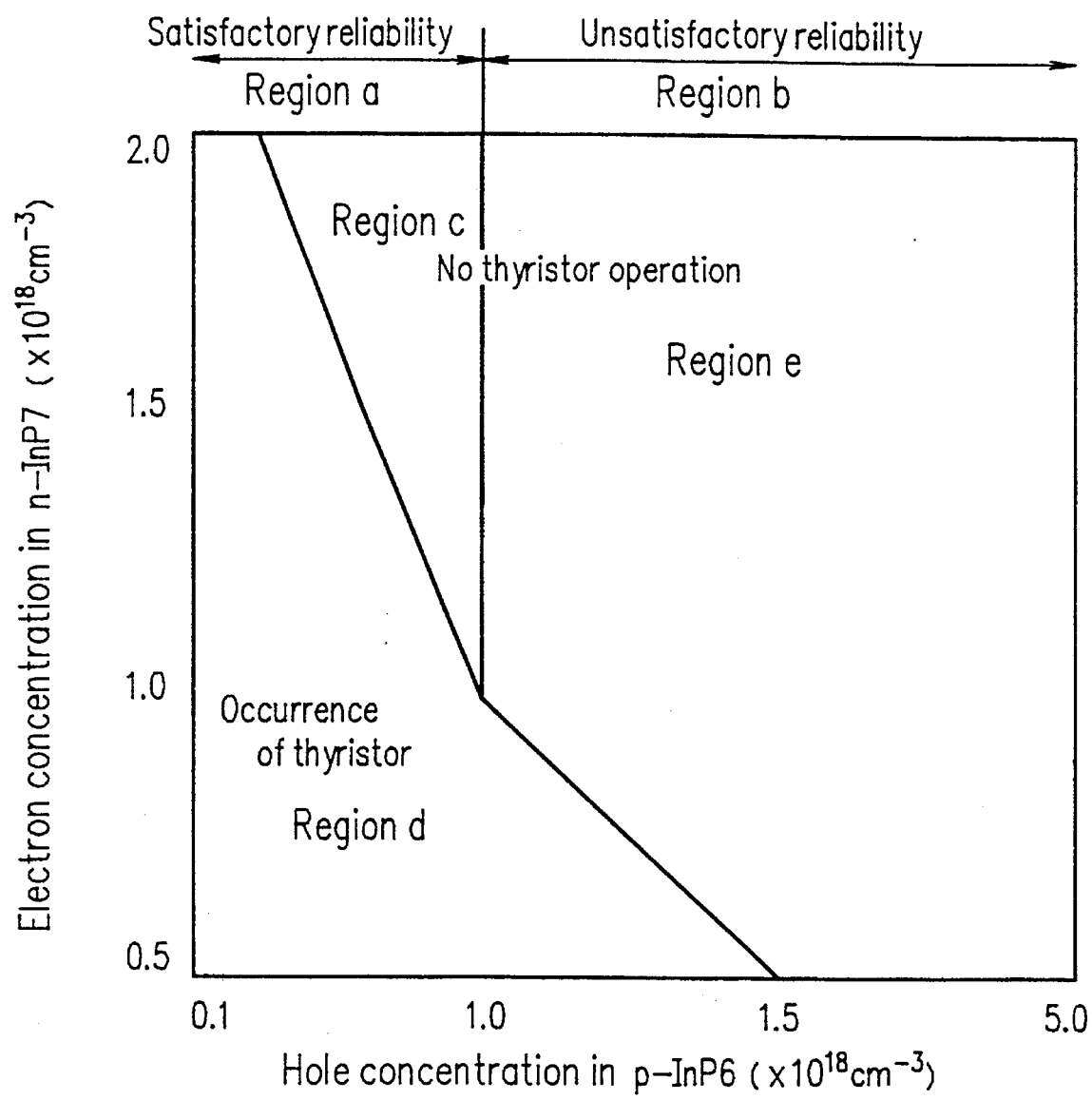
FIG. 10 is a graph showing the relationship between a carrier concentration of a current blocking layer and a thyristor operation of the semiconductor laser shown in FIG. 6A.

FIG. 10 shows the relationship among the respective dopant concentrations of the p-InP first current blocking layer 6 and the n-InP second current blocking layer 7 and the occurrence of the thyristor operation in the semiconductor shown in FIG. 6A. In FIG. 10, region a indicates a region with high reliability and region b indicates a region with poor reliability. Regions c and d indicate regions in which the thyristor operation does not occur. Region d indicates a region in which the thyristor operation may by caused. The respective dopant concentrations of the p-InP first current blocking layer 6 and the n-InP second current blocking layer 7 are preferably set in the region c.

Figure 11:
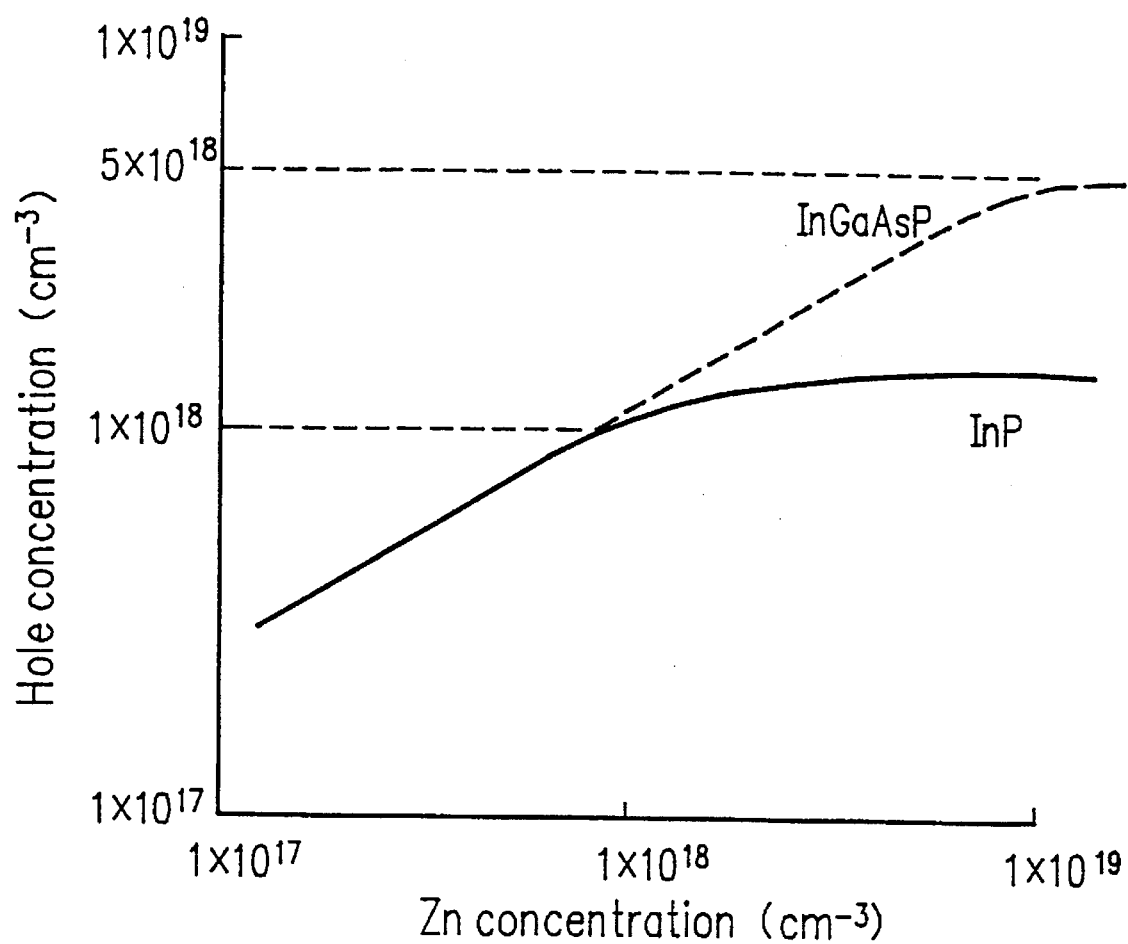
FIG. 11 is a graph showing the relationship between a Zn concentration and a hole concentration.

FIG. 11 shows the relationship between the Zn concentration and the hole concentration. In the case of InP, the hole concentration is saturated at $1 \times 10^{18}$ cm$^{-3}$. In the case of InGaAsP, the hole concentration is saturated at $5 \times 10^{18}$ cm$^{-3}$. In the case where the hole concentration is saturated, if Zn is increased, the Zn is not positioned in the lattice, but interstitially exists. In order to enhance the reliability of a semiconductor laser, it is necessary to reduce the excessive Zn, i.e., Zn which interstitially exists. For this purpose, it is preferred that the Zn concentration is set in the range in which the hole concentration is not saturated. In the case of InP, the Zn concentration is preferably set to be $7 \times 10^{17}$ cm$^{-3}$ or less which is a half or less of the saturated concentration. In the case of InGaAsP, the Zn concentration is preferably set to be $3 \times 10^{18}$ cm$^{-3}$ or less which is a half or less of the saturated concentration.

Figure 12A:
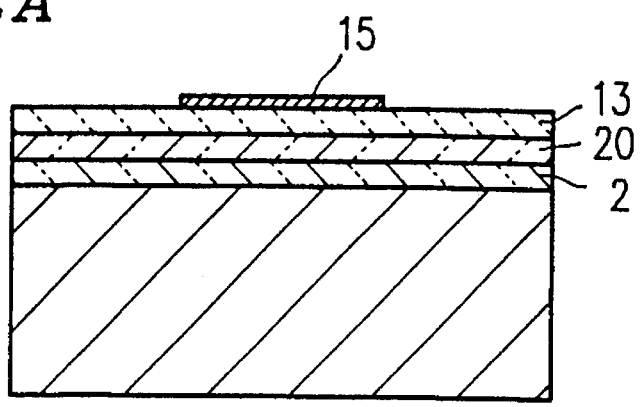
FIGS. 12A through 12C are cross-sectional views showing process steps of a method for producing the semiconductor laser shown in FIG. 6A.
Figure 12B:
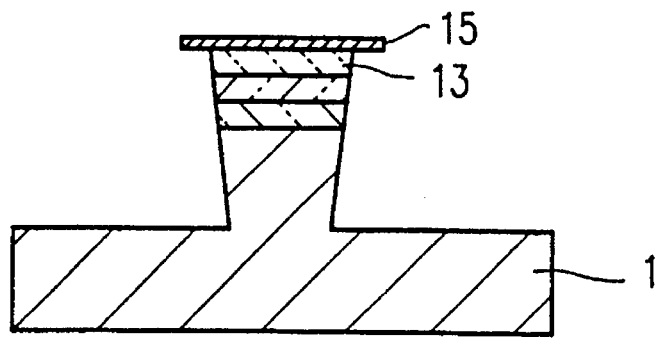
Figure 12C:
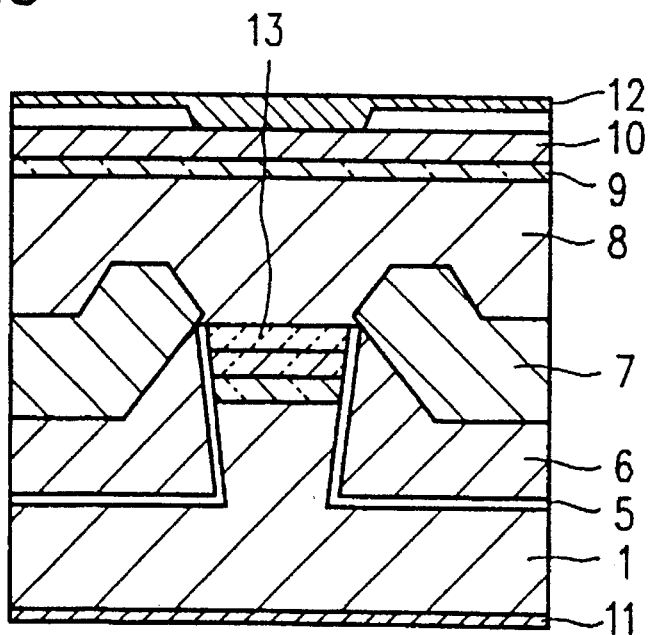

Referring to FIGS. 12A to 12C, the method for producing a semiconductor laser shown in FIG. 6A will be described.

First, on an Sn-doped InP substrate 1, an n-InGaAsP ($\lambda g=1.15$ μm) waveguide layer 2 is grown to have a thickness of 150 nm by MOVPE. Then, a $Ga_{0.1}In_{0.9}As_{0.5}P_{0.5}$ well layer ($\lambda g=1.37$ μm) 3 having a thickness of 4 nm, and a GaInAsP ($\lambda g=1.15$ μm) barrier layer 4 having a thickness of 10 nm are paired, and the pair of well layer 3 and barrier layer 4 is repeatedly grown seven times. Thus, a multilayer well type active layer having 7 pairs is obtained. Thereafter, a p-InP cladding layer 13 having a thickness of 400 nm is grown.

Next, a silicon nitride film is deposited, and then the silicon nitride film is etched into a stripe shape by dry etching, so as to obtain a stripe-shaped silicon nitride film (width: 1.5 to 3 μm) 15. Thereafter, the p-InP cladding layer 13 is etched by using a chloric acid type etchant which substantially does not etch the silicon nitride film 15 but etches the p-InP cladding layer 13. Next, the wafer from the active layer to the upper face of the substrate i is etched by using an acetic acid type etchant. As a result, as shown in FIG. 12B, a stripe-shaped multilayer structure having a reversed mesa shape is obtained. The silicon nitride film 15 in this example is not so overhung, as compared with the silicon nitride film 15 shown in FIG. 3B.

Next, by MOVPE, an undoped InP layer 5 and a p-InP layer 6 and an n-InP layer 7 are epitaxially grown. Then, the silicon nitride film 15 is removed, and a p-InP current blocking layer 8, a p-GaInAsP barrier reducing layer 9 and a p-GaInAs contact layer 10 are grown by MOVPE in a burying manner. Thereafter, an n-side electrode 11 and a p-side electrode 12 are vapor deposited, so as to obtain the structure shown in FIG. 12C.

Figure 14:
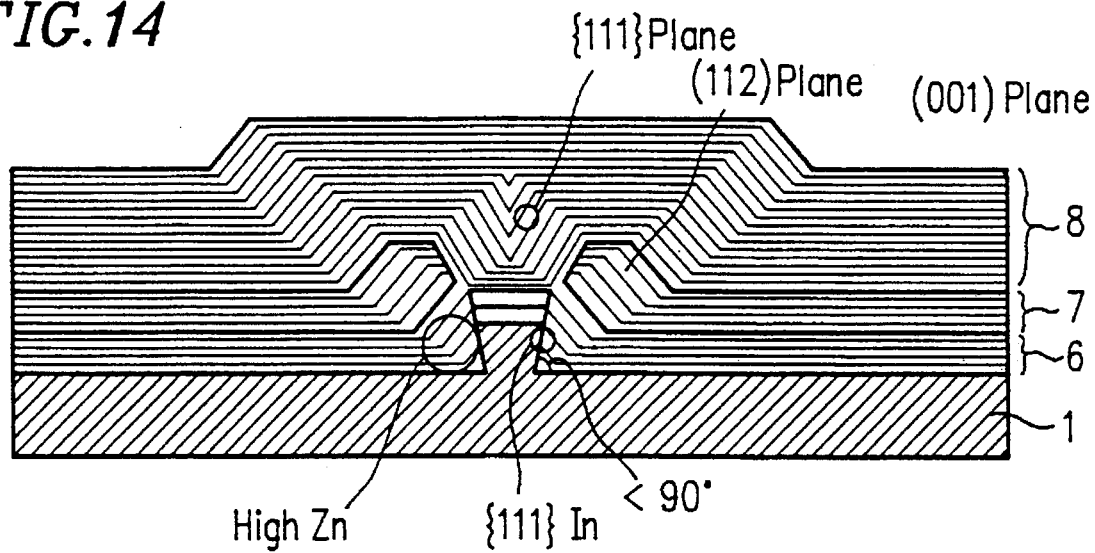
FIG. 14 is a cross-sectional view showing the growth of a current blocking layer of the semiconductor laser shown in FIG. 6A.

FIG. 14 is a cross-sectional view schematically showing the growth process of the p-InP first current blocking layer 6, the n-InP second current blocking layer 7, and the p-InP third current blocking layer 8. In this example, the side face of the ridge providyed on the substrate is constituted by a plane including a {111}In plane. The angle formed by the side face of the ridge and the upper face of the substrate, i.e., a (001) plane is smaller than 90 degrees. In the vicinity of the ridge, the face on which the p-InP first current blocking layer 6 is Grown is a (112) plane. In the case where the Growth face is the (112) plane, many dangling bonds are Generated and a lot of impurities are taken therein, as compared with the case where the Growth face is a (114) plane. Above the active layer 20, a (001) plane is obtained.

Hereinafter, referring back to FIG. 4, the method for forming the p-InP first current blocking layer 6 and the like is described in detail. Also in this example, during the heating for 5 minutes, the substrate 1 is exposed to a mixed atmosphere of PH$_3$ and AsH$_3$ in the chamber of the MOVPE apparatus. Immediately after 5 minutes from the start of the heating, the growth of the undoped InP layer 5 is started. After an interval of 10 minutes from the completion of the formation of the undoped InP layer 5, the p-InP layer 6 is formed. The purpose of this is to sufficiently raise the temperature of the substrate 1 before the growth of the p-InP layer 6. As a result, the dopant (Zn) in the p-InP layer 6 in the vicinity of the active layer is prevented from being increased. Similarly, in this example, the crystal Growth temperature was set to be 600° C. The current blocking layer 6 is preferably formed by the above-described method. However, in Examples 1 and 2, either one of the methods shown in FIG. 4 can be adopted.

In order to suppress the leakage current, the thickness of the second current blocking layer needs to be larger. In this example, an insulating film stripe with good adhesion is formed on the cladding layer, and the width of the cap layer is set to be substantially equal to the mask width. As a result, there is no shadow effect by the mask, and the elements on the mask are supplied by diffusion. Thus, the growth rate is increased. As a result, as shown in FIGS. 7C and 7D, the thickness in the vicinity of the stripe is made larger, and the leakage current due to a punch through, i.e., the contact of depletion layers generated in the second current blocking layer is suppressed. Accordingly, by confining the current into the active layer, the light emission current can be increased. Herein, the growth temperature is set to be the lower limit of the growth temperatures at which good crystallinity can be obtained, i.e., 600° C. Thus, the excessive elements supplied from the mask are prevented from dissipating on the crystal by diffusion. Since the width of the cap layer and the mask width are equal to each other, the side face of the stripe includes a step constituted by a {111}In plane. The angle formed by this face is 90 degrees or less, so that the surface of the crystal in the vicinity of the stripe is close to a (112) plane as shown in FIG. 2B, and hence the growth rate is further promoted. As shown in FIG. 2B, in the case of the {111}P plane, the growth progresses while exhibiting the (114) plane, so that the growth rate is about 70% of the case of the (112) plane. This stripe shape can be obtained by etching the cladding layer with a chloric acid type etchant and then by etching it with an acetic acid type etchant.

In Examples 1 and 2, as the material of the p-type current blocking layers 6 and 8, InP was used. Alternatively, a material from InGaAsP to InGaAs can be used instead of InP. The material from InGaAsP to InGaAs has a higher Zn solid solubility as compared with InP, so that the influence of Zn diffusion on the active layer 20 can be further reduced.

As the material of the first and second current blocking layers 6 and 7, if a material having a bandgap larger than that of InP such as a material from InGaAsP to InGaP is used, the occurrence of a thyristor operation can easily be suppressed. Alternatively, as the material of the third current blocking layer 8, if a material having a bandgap larger than that of InP such as a material from InGaAsP to InGaP is used, the occurrence of a thyristor operation can easily be suppressed, and the leakage current can be further reduced.

In Examples 1 and 2, crystals of InP type compound semiconductor are used. Alternatively, crystals of other types of semiconductor materials such as GaAs, ZnSe, InAlAs, AlGaAs, and GaInAlAsP may also be used.

The present invention can be applied to a laser with high additional value such as a DFB laser and a DBR laser in addition to the DH laser. The structure of the burying layers of PBH type was employed in Examples 1 and 2. It is appreciated that any other structure can also be used.

In addition, in Examples 1 and 2, the active layer 20 of quantum well structure is employed. It is appreciated that a strained quantum well structure can be adopted.

The waveguide layer is formed of a simple InGaAsP layer. Alternatively, the waveguide layer may be formed of an InGaAsP layer having a grated composition. The crystal growth method is not limited to the MOVPE. Alternatively, other methods such as gas source MBE, MOMBE, hydride VPE can also be used.

The dopant is not limited to Zn or Si. Any other type of dopant can be used. As the insulating film, a silicon nitride film is used. Alternatively, the insulating film can be made of a material with good selectivity, such as an oxide film. As the substrate, an n-type substrate is used. Alternatively, a p-type substrate can be used.

EXAMPLE 3

Figure 15A:
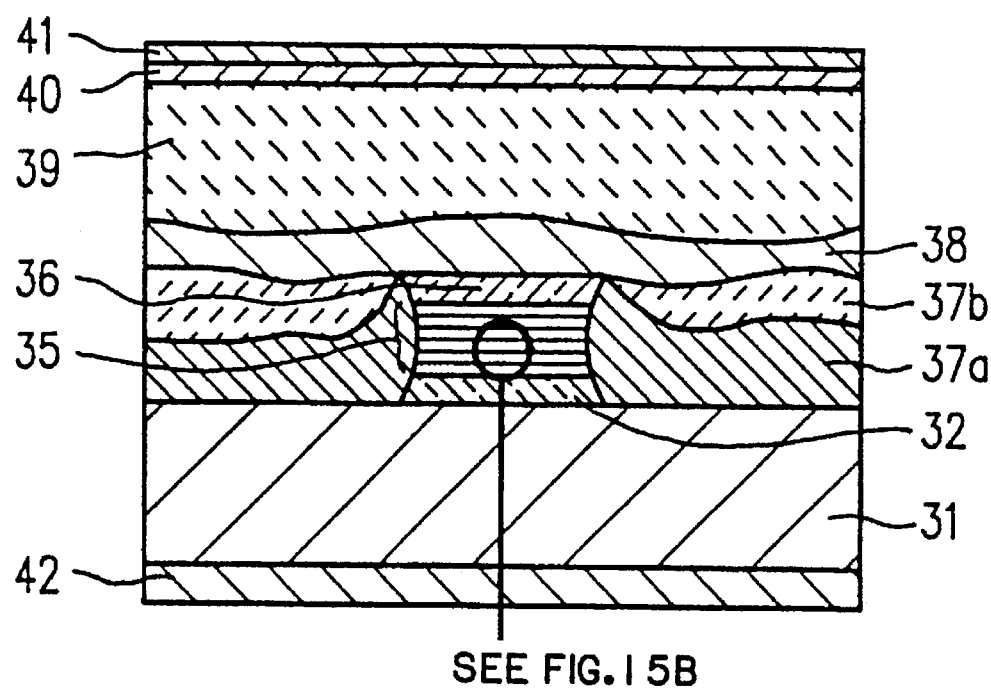
FIG. 15A and 15B are cross-sectional views showing still another semiconductor laser according to the invention.
Figure 15B:
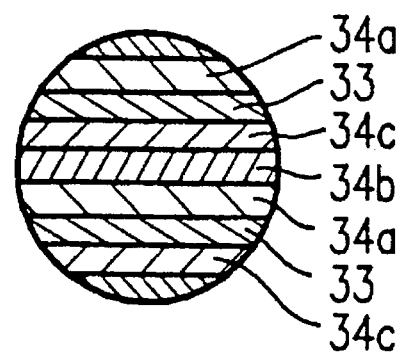

FIG. 15A and 15B show the cross section of another example of a semiconductor laser according to the invention. The semiconductor laser includes an Sn-doped n-InP substrate 31, and a stripe-shaped multi-layer structure formed on the InP substrate 31. The stripe-shaped multi-layer structure includes strained quantum well type active layer 35 having a graded doped structure. The active layer 35 includes a strained well layer (6 nm) 33 having a compressive strain of 1%, and an InGaAsP barrier layer (thickness: 15 nm) 34 having a bandgap wavelength of 1.31 μm. The number of wells is five. The barrier layer 34 includes an undoped InGaAsP layer 34a, a Zn-doped InGaAsP layer (Zn concentration: $5 \times 10^{18}$ cm$^{-3}$) 34b, and an undoped InGaAsP layer 34c.

In the stripe-shaped multi-layer structure, the strained quantum well type active layer 35 of the graded doped structure is sandwiched between an n-type InGaAsP waveguide layer (thickness: 30 nm) 32 and a p-type InGaAsP waveguide layer (thickness: 100 nm) 36. The p-type InGaAsP waveguide layer 36 is doped with Zn of $5 \times 10^{17}$ cm$^{-3}$.

On both sides of the stripe-shaped multi-layer structure, a current blocking portion is provided for confining the current in the stripe-shaped multi-layer structure. The current blocking portion includes a p-type InP layer 37a and an n-type InP layer 37b, and hence a PN junction is formed therein. When the semiconductor laser is driven, a reversed bias is applied to the PN junction.

A diffusion suppressing layer (thickness: 200 nm, Zn concentration: $5 \times 10^{17}$ cm$^{-3}$) 38 is formed so as to cover both the stripe-shaped multi-layer structure and the current blocking portion. On the diffusion suppressing layer 38, a p-type InP cladding layer (thickness: 4 μm, Zn concentration: $5 \times 10^{17}$ cm$^{-3}$) 39, a p-type InGaAs cap layer (thickness: 200 nm, Zn concentration: $5 \times 10^{18}$ cm$^{-3}$) 40, and a p-side electrode 41 are formed in this order. On the back face of the substrate 31, an n-side electrode 42 is provided.

When the p-type InP cladding layer 39 interstitially contains the dopant, the p-type InP cladding layer 39 functions as a source of the dopant. In this example, Zn is used as the p-type dopant, so that the invention is described as to the Zn diffusion. If any other dopant such as Be, Mg, Cd, Se, S, Te, or C is used, the same description can be made.

The solid solubility of Zn in the InP layer depends on the growth conditions of the InP layer (the temperature, the total gas flow rate, and the like), but the solid solubility of Zn in the InP layer is about $1 \times 10^{18}$ cm$^{-3}$. When the Zn concentration of the p-type InP cladding layer 39 is set to be $5 \times 10^{17}$ cm$^{-3}$ or less, the concentration of Zn which interstitially exists in the cladding layer 39 is lowered so as to be negligible. Therefore, the Zn diffusion from the p-type InP cladding layer 39 to the active layer 35 is significantly suppressed.

In this example, not only the Zn concentration of the p-type InP cladding layer 39 is lowered, but also two types of InGaAsP layers, i.e., the p-type InGaAsP waveguide layer 36 and the p-type InGaAsP diffusion suppressing layer 38 are provided between the p-type InP cladding layer 39 and the active layer 35. InGaAsP functions for sufficiently solid-solving even when Zn interstitially existing in the p-type InP cladding layer 39 positioned above is diffused, so that the Zn is substantially prevented from being diffused below. Therefore, the graded doped structure of the strained quantum well active layer 35 is not eventually destroyed but maintained.

In order to reduce the resistance, the p-type InGaAsP waveguide layer 36 and the p-type InGaAsP diffusion suppressing layer 38 are doped with Zn of $5 \times 10^{17}$ cm$^{-3}$. However, the solid solubility of InGaAsP is much higher than $1\times10^{18}$ cm$^{-3}$, so that the doped Zn interstitially exists, and substantially does not contribute to the diffusion.

If the p-type InGaAsP diffusion suppressing layer 38 is not provided but only the p-type InGaAsP waveguide layer 36 is provided between the p-type cladding layer 39 and the active layer 35, it is necessary to make the thickness of the p-type InGaAsP waveguide layer 36 sufficiently large. However, as the thickness of the p-type InGaAsP waveguide layer 36 is made larger, more leakage current flows from the p-type InP cladding layer 39 to the p-type InP layer 37a via the side portion of the p-type InGaAsP waveguide layer 36. According to this invention, an InGaAsP layer having a necessary thickness can be provided between the p-type InP cladding layer 39 and the active layer 35 while the thickness of the p-type InGaAsP waveguide layer 36 is maintained to be a thickness by which the leakage current is not greatly increased, so that the above-mentioned problems never occur.

In order to make the light distribution of the semiconductor laser uniform, it is preferred that the p-type InP cladding layer 39 has a sufficiently large thickness (e.g., equal to 4 microns or more). In order to make the p-type InP cladding layer 39 thicker, it is necessary to perform the crystal growth for a long time at the growth temperature. If the diffusion suppressing layer 38 is not provided during the growth of the thick p-type InP cladding layer 39, there arises a problem of dopant diffusion from the p-type cladding layer 39 to the active layer 35. However, according to the invention, the problem does not occur due to the provision of the diffusion suppressing layer 38. Accordingly, the p-type InP cladding layer 39 can be grown so as to have a desired thickness, and a semiconductor laser having superior light distribution can be obtained.

The band gap of the diffusion suppressing layer (InGaAsP) 38 used in this example is smaller than the band gap of InP, so that the injected current hardly flows into the p-type InP layer 37a which constitutes the current blocking portion. As a result, the leakage current which does not contribute to the light emission can be advantageously reduced. Therefore, the linearity of the light output to injected current characteristics is improved, so that the modulation strain can be reduced as compared with analog modulation.

Hereinafter, referring to FIGS. 16A to 16D, the reduction of leakage current by the diffusion suppressing layer 38 will be described.

Figure 16A:
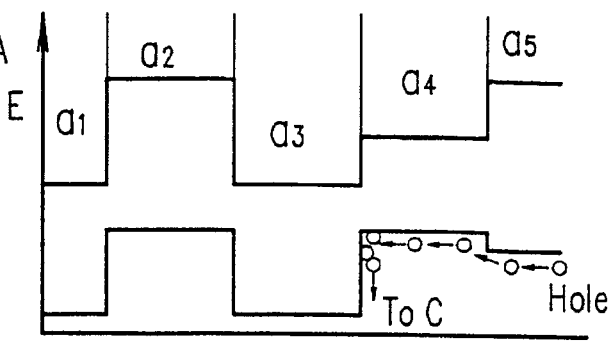
FIG. 16A is a band diagram along current path A.
Figure 16B:
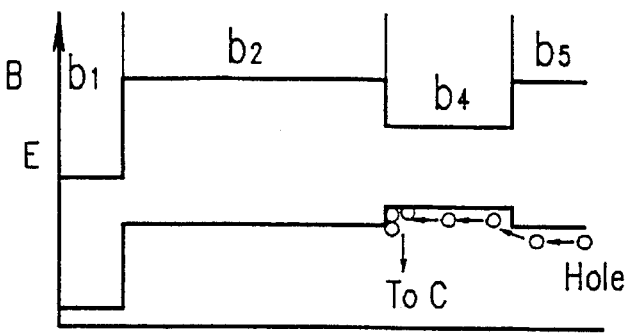
FIG. 16B is a band diagram along current path B.
Figure 16C:
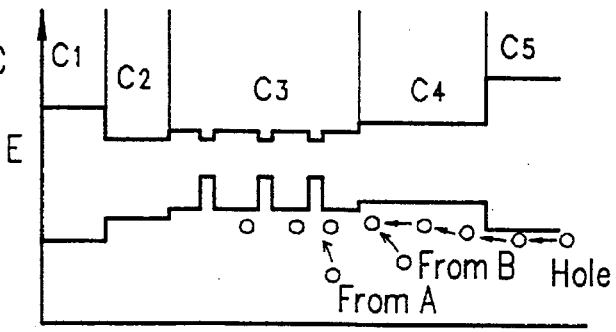
FIG. 16C is a band diagram along current path C.
Figure 16D:
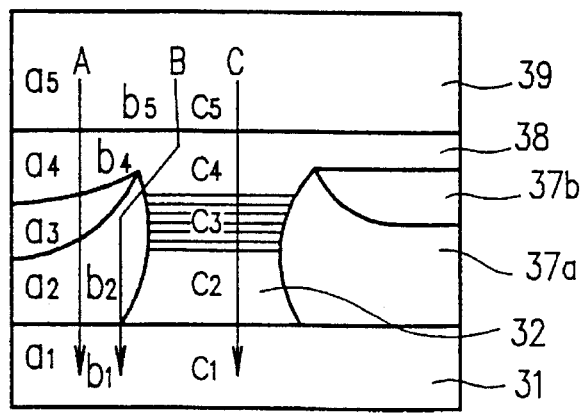
FIG. 16D is a schematic cross-sectional view corresponding to the cross section shown in FIG. 1A.

FIG. 16D is a schematic diagram of a cross section corresponding to the cross-sectional view of FIG. 15A, and shows three kinds of current paths A, B, and C. The current path C shows a path of an effective current which contributes to the laser oscillation. The current paths A and B show paths of ineffective currents which do not contribute to the laser oscillation. In FIG. 16D, a5 to a5, b1 to b5, and c1 to c5 are regions of semiconductor through which the current flows for the respective current paths.

As shown in FIG. 16A, the band gap of the diffusion suppressing layer 38 is smaller than the band gap of the n-type InP layer 37b, so that there exists an energy gap between the region a4 and the region a3. Therefore, the current cannot flow from the region a4 to the region a3, and a current A does not occur until the thyristor state is established. Holes injected from the region a5 to the region a4 are injected into the region c3.

As shown in FIG. 16B, the band gap of the diffusion suppressing layer 38 is smaller than the band gap of the p-type InP layer 37a, so that there exists an energy gap between the region b4 and the region b2. Therefore, the current hardly flows from the region b4 to the region b2, so that the current B is extremely small.

As shown in FIG. 16C, holes from the regions a5 and b5 to the regions a4 and b4, respectively, flow into the region c3.

As described above, according to this example, the current introduced from the p-side electrode 41 is efficiently confined in the stripe-shaped multi-layer structure by the function of the current blocking portion 37 and the diffusion suppressing layer 38. The current confined in the stripe-shaped multi-layer structure is injected into the active layer 35 and contributes to the laser oscillation. In order to obtain light having a wavelength of 1.31 μm, the thickness of the strained well layer 33 of the active layer 35 is set to be a required value depending on the composition of the semiconductor material used for the strained well layer 33. In this example, the strained well layer 33 is formed of $Ga_{0.1}In_{0.9}As_{0.5}P_{0.5}$, and the thickness thereof is set to be 6 nm. By calculation, light having a wavelength of 1.41 μm is obtained from the bulk semiconductor material of $Ga_{0.1}In_{0.9}As_{0.5}P_{0.5}$. In this example (the cavity length is 300 μm), it is confirmed that light having a wavelength of 1.30 μm is obtained. This energy shift (70 meV) is caused by the quantum size effect. The oscillation threshold value was 15 mA, the reducing oscillation frequency was 2.2 GHz/mA$^{1/2}$, and the transmission strain IM2 was less than −65 dBc (modulation factor 20%). This is because the leakage current is reduced, and the graded doped structure of the strained quantum well type active layer 35 is maintained.

The diffusion suppressing layer 38 of this example has a one-layer structure, but alternatively may have a structure of two or more layers. In such a case, the property that the energy band gap thereof is lower than that of the current blocking portion and the property that the impurity solid solubility thereof is higher than that of the p-type cladding layer can be realized by different layers.

Next, referring to FIGS. 17A to 17D, the method for producing the semiconductor laser shown in FIG. 15A will be described.

Figure 17A:
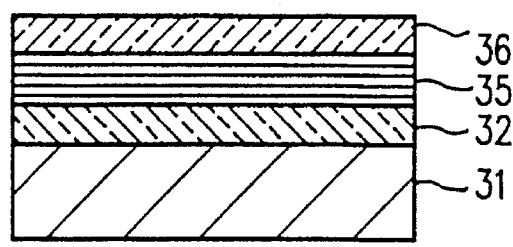
FIGS. 17A through 17D are cross-sectional views showing process steps of a method for producing the semiconductor laser shown in FIG. 1A.

First, on an Sn-doped n-type InP substrate 31, an n-type InGaAsP waveguide layer (λg=1.31 μm) 32 is grown by MOVPE. Next, a $Ga_{0.3}In_{0.7}As_{0.5}P_{0.5}$ strained well layer 33 having a compression strain of 1% and an InGaAsP barrier layer (λg=1.31 μm) 34 are alternately grown 5 times. Thus, a quantum well type active layer 35 having a graded doped structure including five quantum well layers is formed. Thereafter, a p-type InGaAsP waveguide layer (λg=1.31 μm) 36 is further grown. As a result, a structure shown in FIG. 17A is obtained.

Figure 17B:
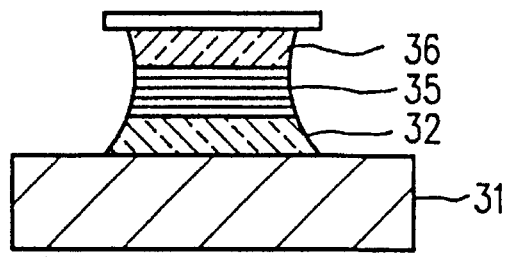

Next, by using a silicon nitride film patterned into a stripe shape as an etching mask, the p-type InGaAsP waveguide layer 36, the graded doped quantum well type active layer 35, and the n-type InGaAsP waveguide layer 32 are selectively etched into a mesa shape. Thus, a stripe-shaped multilayer structure including the active layer 35 is obtained as shown in FIG. 17B.

Figure 17C:
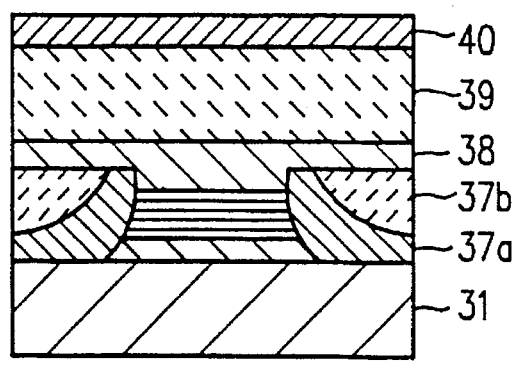
Figure 17D:
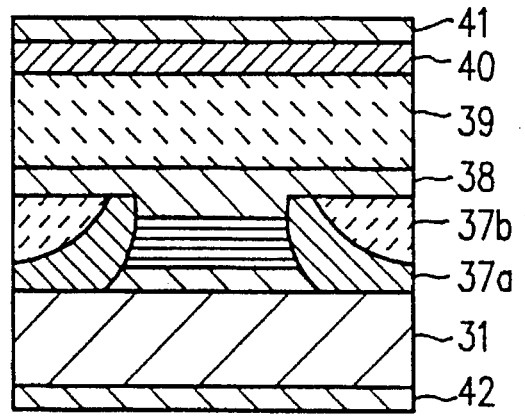
Figure 18:
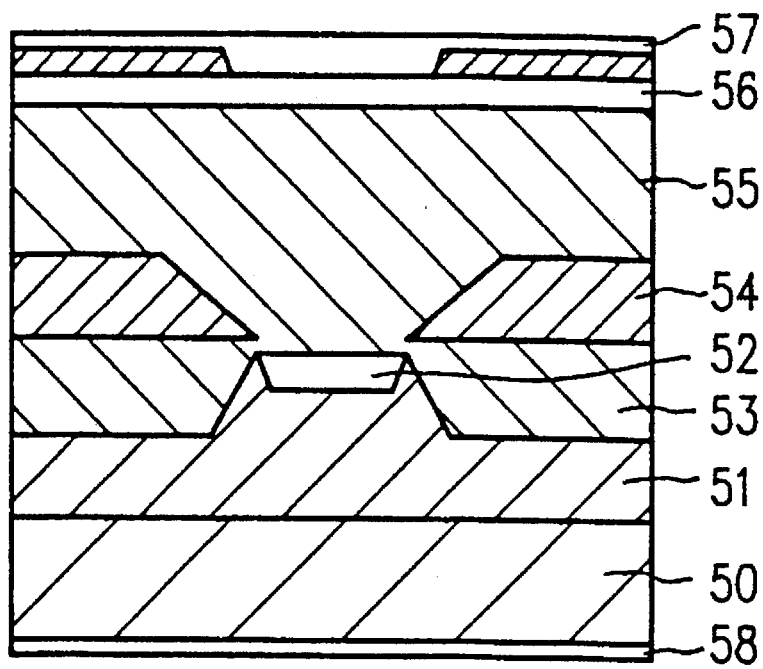
FIG. 18 is a cross-sectional view showing a conventional semiconductor laser.
Figure 19:
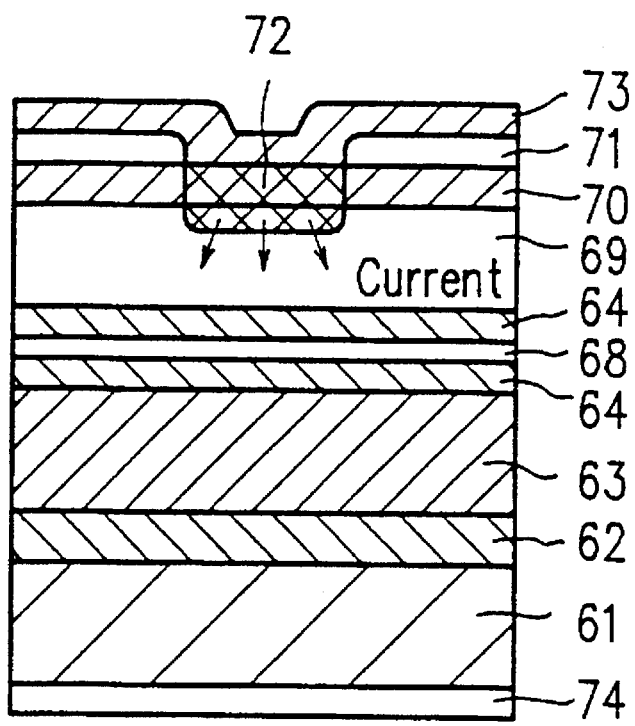
FIG. 19 is a cross-sectional showing another conventional semiconductor laser.
Figure 20:
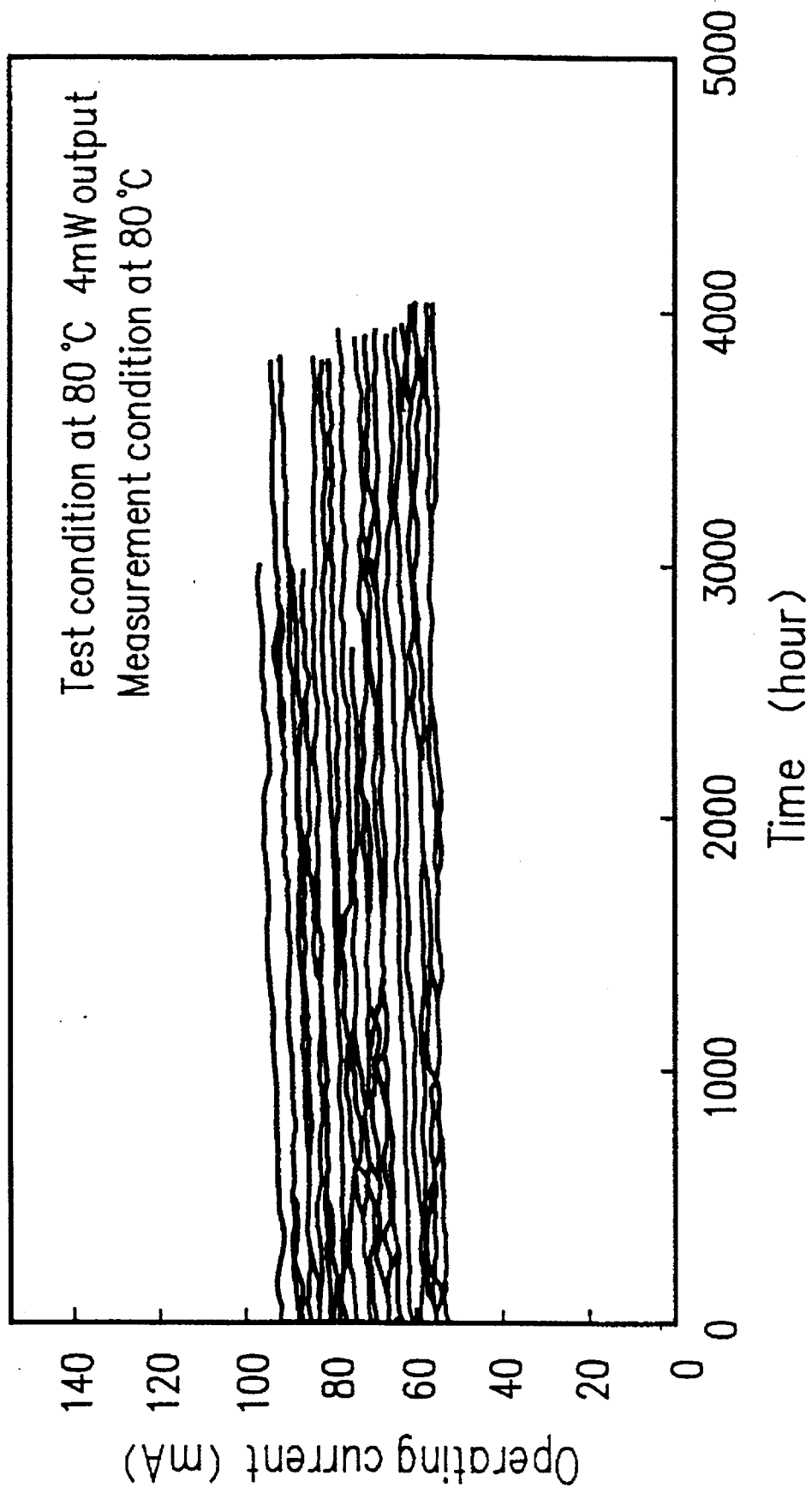
FIG. 20 is a graph showing the result of a long-term high-temperature and acceleration test for a conventional semiconductor laser.

Then, a p-type InP layer 37a and an n-type InP layer 37b constituting a current blocking portion are selectively grown on both sides of the stripe-shaped multilayer structure by MOVPE. After the silicon nitride film is removed, a diffusion suppressing layer 38, a p-type InP cladding layer 39, and a p-type InGaAs cap layer 40 are grown by MOVPE. Thus, a structure shown in FIG. 17C is obtained.

Finally, by vapor deposition, a p-side electrode 41 and an n-side electrode 42 are formed.

In the crystal growth step by MOVPE, the total flow rate through the growth chamber was 5 L/min, and the growth temperature was 640° C.

The growth of the diffusion suppressing layer 38 on the current blocking portion is achieved by supplying $AsH_3$ and $PH_3$ into the growth chamber at 640° C. Until the temperature reaches 640° C., $AsH_3$ and $PH_3$ which will flow for growing the diffusion suppressing layer 38 is supplied into the growth chamber, so that the defects at the interface between the waveguide layer 36 and the diffusion suppressing layer 38 are reduced.

As a well layer, a strained well layer having a compression strain of 1% was used. However, the graded doped effect does not depend on the magnitude of the strain, so that the magnitude of strain may be set to another value (e.g., a value causing tension). As the construction of the semiconductor laser, instead of the DH structure, a DFB structure and a DBR structure can also be adopted. In addition, a construction other than PBH can be doped for the current blocking portion.

The invention can be applied to another electric device (HEMT, HFET, and HBT), a waveguide device, a photodetective device, and the like, in addition to the semiconductor laser, insofar as the device has the graded doped quantum well structure. Especially, when the invention is applied to the semiconductor lasers shown in FIGS. 1A and 6A, the reliability is further enhanced and the leakage current is further reduced.

In the first current blocking layer in this invention, the impurity concentration is relatively lowered in the region thereof closer to the stripe-shaped multilayer structure including the active layer, so that the impurity has no adverse influence on the active layer. Therefore, the reliability of the semiconductor laser is enhanced. In addition, the concentration of the impurities introduced into regions of the first current blocking layer away from the active layer can be made high. Thus, the resultant current blocking portion has a structure in which the thyristor operation is difficult to occur. As a result, the leakage current is reduced.

In addition, by increasing the angle at the end portion of the second current blocking layer, the punch through hardly occurs within the end portion.

Moreover, according to the invention, due to the function of the diffusion suppressing layer, the graded doped structure of the quantum well type active layer is not eliminated in the production process, and can attain the inherent effects thereof. The diffusion suppressing layer covers both the stripe-shaped multilayer structure and the current blocking portion, and the diffusion suppressing layer has a bandgap which is smaller than that of the current blocking portion, so that an ineffective current flowing into the current blocking portion can be reduced. In the stripe-shaped multilayer structure, a waveguide layer formed of a material having the same properties as those of the diffusion suppressing layer is provided, so that the graded doped structure can be more stably maintained.

As described above, the current confinement efficiency is enhanced while the graded doped structure can actually attain the effects thereof, so that the ineffective current can be reduced. As a result, the linearity of the relationship between the injected current and the light output is improved and it is possible to provide a semiconductor laser having a low transmission strain characteristic.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser comprising:

a semiconductor substrate of a first conductivity type;

a stripe-shaped multilayer structure, formed on the semiconductor substrate, the stripe-shaped multilayer structure including an active layer; and a current blocking portion formed on the semiconductor substrate on both sides of the stripe-shaped multilayer structure, wherein the current blocking portion has a first current blocking layer of a second conductivity type, and a second current blocking layer of the first conductivity type formed on the first current blocking layer, the first current blocking layer includes a low-concentration region having a relatively low concentration of an impurity of the second conductivity type, and a high-concentration region having an impurity concentration which is higher than that of the low-concentration region, and the low-concentration region is provided at a position closer to the stripe-shaped multilayer structure than the high-concentration region.

2. A semiconductor laser according to claim 1, wherein the first and the second current blocking layers are deposited by organic metal vapor phase epitaxy.

3. A semiconductor laser according to claim 1, wherein the low-concentration region of the first current blocking layer has a thickness which becomes thinner toward the stripe-shaped multilayer structure.

4. A semiconductor laser according to claim 1, wherein the impurity concentration of the high-concentration region of the first current blocking layer is $2\times10^{18}$ cm$^{-3}$ or less, and a concentration of an impurity of the first conductivity type of the second current blocking layer is $1\times10^{18}$ cm$^{-3}$ or more.

5. A semiconductor laser according to claim 1, wherein a side face of the stripe-shaped multilayer structure is a crystal plane including a {111}P plane.

6. A semiconductor laser according to claim 1, further comprising an undoped semiconductor layer provided between the current blocking portion and a surface of the semiconductor substrate and the side face of the stripe-shaped multilayer structure.

7. A semiconductor laser according to claim 1, wherein the active layer has a multiquantum well structure.

8. A semiconductor laser according to claim 1, further comprising a semiconductor layer of the second conductivity type which covers both the stripe-shaped multilayer structure and the current blocking portion, the semiconductor layer having a bandgap different from that of the current blocking portion.

9. A semiconductor laser comprising:

a semiconductor substrate of a first conductivity type;

a stripe-shaped multilayer structure, formed on the semiconductor substrate, the stripe-shaped multilayer structure including an active layer; and a current blocking portion formed on the semiconductor substrate on both sides of the stripe-shaped multilayer structure, wherein the current blocking portion has a first current blocking layer of a second conductivity type, and a second current blocking layer of the first conductivity type formed on the first current blocking layer, and one of two end portions of the second current blocking layer which is closer to the stripe-shaped multilayer structure has an apex angle 60 degrees or more.

10. A semiconductor laser according to claim 9, wherein a concentration of an impurity of the second conductivity type of the first current blocking layer is $1 \times 10^{18}$ cm$^{-3}$ or less, and a concentration of an impurity of the first conductivity type of the second current blocking layer is $1 \times 10^{18}$ cm$^{-3}$ or more.

11. A semiconductor laser according to claim 9, wherein a side face of the stripe-shaped multilayer structure is a crystal plane including a {111}In plane.

12. A semiconductor laser according to claim 9, further comprising an undoped semiconductor layer provided between the current blocking portion and a surface of the semiconductor substrate and the side face of the stripe-shaped multilayer structure.

13. A semiconductor laser according to claim 9, wherein one of two end portions of the second current blocking layer which is closer to the stripe-shaped multilayer structure has an apex angle of 80 degrees or more.

14. A semiconductor laser according to claim 9, wherein the active layer has a multiquantum well structure.

15. A semiconductor laser according to claim 9, further comprising a semiconductor layer of the second conductivity type which covers both the stripe-shaped multilayer structure and the current blocking portion, the semiconductor layer having a bandgap different from that of the current blocking portion.

16. A semiconductor laser comprising:

a semiconductor substrate of a first conductivity type;

a stripe-shaped multilayer structure including a quantum well type active layer having a graded doped structure formed on the semiconductor substrate;

a current blocking portion formed on both sides of the stripe-shaped multilayer structure, for confining a current in the stripe-shaped multilayer structure; and a semiconductor layer of a second conductivity type formed above the stripe-shaped multilayer structure and the current blocking portion, wherein the semiconductor laser further includes a diffusion suppressing layer covering both the stripe-shaped multilayer structure and the current blocking portion for suppressing an impurity included in the semiconductor layer of the second conductivity type from diffusing into the active layer, the diffusion suppressing layer having a bandgap which is smaller than that of the current blocking portion.

17. A semiconductor laser according to claim 16, wherein the diffusion suppressing layer has a solid solubility larger than that of the semiconductor layer of the second conductivity type with respect to the impurity doped in the semiconductor layer of the second conductivity type.

18. A semiconductor laser according to claim 18, wherein the current blocking portion is formed of InP, the semiconductor layer of the second conductivity type is formed of Zn-doped InP, and the diffusion suppressing layer is formed of InGaAsP.

19. A semiconductor laser according to claim 16, wherein the stripe-shaped multilayer structure includes a waveguide layer having a solid solubility larger than that of the semiconductor layer of the second conductivity type with respect to the impurity doped in the semiconductor layer of the second conductivity type, the waveguide layer being provided between the active layer and the diffusion suppressing layer.

* * * * *

UNITED STATES PATENT AND TRADE MARK OFFICE
CERTIFICATE OF CORRECTION

PATENT NO. : 5,568,501
DATED : October 22, 1996
INVENTOR(S) : Otsuka et al.

It is certified that error appears in the above-identified patent and that said Letters Patent is hereby corrected as shown below:

Column 21, line 3, between "angle" and "60" insert --of--.

Column 22, line 21, delete "claim 18" and insert therefor --claim 17--.

Signed and Sealed this

Twenty-fifth Day of March, 1997

*Attest:*

BRUCE LEHMAN

*Attesting Officer*     *Commissioner of Patents and Trademarks*